United States Patent
Takamoto et al.

(10) Patent No.: US 7,488,890 B2
(45) Date of Patent: Feb. 10, 2009

(54) COMPOUND SOLAR BATTERY AND MANUFACTURING METHOD THEREOF

(75) Inventors: Tatsuya Takamoto, Ikoma-gun (JP);
Takaaki Agui, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 804 days.

(21) Appl. No.: 10/805,419

(22) Filed: Mar. 22, 2004

(65) Prior Publication Data

US 2004/0206389 A1 Oct. 21, 2004

(30) Foreign Application Priority Data

| Apr. 21, 2003 | (JP) | ............................. 2003-115360 |
| Apr. 28, 2003 | (JP) | ............................. 2003-123328 |

(51) Int. Cl.
*H01L 31/00* (2006.01)
*H01L 21/00* (2006.01)

(52) U.S. Cl. ........................................ 136/255; 438/93

(58) Field of Classification Search ......... 136/243–265; 438/93

See application file for complete search history.

(56) References Cited

U.S. PATENT DOCUMENTS

| 4,774,194 | A | * | 9/1988 | Hokuyou | ..................... 438/72 |
| 5,458,694 | A | | 10/1995 | Nuyen | |
| 6,281,426 | B1 | | 8/2001 | Olson et al. | |

2001/0055854 A1   12/2001   Nishida et al.

FOREIGN PATENT DOCUMENTS

| JP | 62-291183 A | | 12/1987 |
| JP | 03-235376 | * | 10/1991 |
| JP | 6-511357 A | | 12/1994 |

OTHER PUBLICATIONS

"Threading dislocations in INxGa1xAS/GaAs heterostructures", M. Tamura et al., J. Appl. Phys 72(8), Oct. 15, 1992, pp. 3398-3405.
"Photocurrent of 1 eV GaInNAs lattice-matched to GaAs", J.F. Geisz et al., Journal of Crystal Growth 195 (1998), pp. 401-408.
"Ultrathin GaAs Solar Cells Using Germanium Substrates", C.R. Huggins et al., Proceedings of the 22nd Photovoltaic Specialist Conference (1991), pp. 318-322.

(Continued)

*Primary Examiner*—Nam X Nguyen
*Assistant Examiner*—Jeffrey T. Barton
(74) *Attorney, Agent, or Firm*—Nixon & Vanderhye, P.C.

(57) ABSTRACT

On a surface of a GaAs substrate, layers to be a top cell are formed by epitaxial growth. On the top cell, layers to be a bottom cell are formed. Thereafter, on a surface of the bottom cell, a back surface electrode is formed. Thereafter, a glass plate is adhered to the back surface electrode by wax. Then, the GaAs substrate supported by the glass plate is dipped in an alkali solution, whereby the GaAs substrate is removed. Thereafter, a surface electrode is formed on the top cell. Finally the glass plate is separated from the back surface electrode. In this manner, a compound solar battery that improves efficiency of conversion to electric energy can be obtained.

4 Claims, 18 Drawing Sheets

OTHER PUBLICATIONS

"Over 30% Efficient InGaP/GaAs/GaSb Cell-Interconnected-Circuites For Line-Focus Concentrator Arrays", Lewis Frass et al., Proceedings of the 28th Photovoltaic Specialist Conference (2000), pp. 1150-1153.

Sugimoto et al, "Formation of GaAs Thin Films for Photovoltaic Applications by Peeled Film Technology", Electrical Engineering in Japan, vol. 99, No. 4, 1979, pp. 1-7.

Yukimoto, "Research Advances for GaAs Solar Cells", JEE, Jun. 1982, pp. 39-42.

Kim et al, "High Specific Power (alGaAs)GaAs/CuInSe$_2$ Tandem Junction Solar Cells for Space Applications", Proceedings of the 24th Intersociety Energy Conversion Engineering Conference (IECEC) 89, vol. 2, 1989, pp. 779-784.

Fan et al, "Thin-Film GaAs Solar Cells", Fifteen IEEE Photovolatic Specialists Conference, 1981, pp. 666-672.

Fan et al, "GaAs Cleft Solar Cells for Space Applications" Conference Record of the Seventeenth IEEE Photovoltaic Specialists Conference, 1984, pp. 31-35.

Japanese Office Action and English translation thereof mailed Oct. 14, 2008 in corresponding Japanese application 123328/2003.

* cited by examiner

| n | GaAs | 22 | |
|---|---|---|---|
| p | GaAs | 21 | |
| p | InGaP | C24 | |
| p | GaAs | C23 | C2 |
| n | GaAs | C22 | |
| n | AlInP | C21 | |
| n | InGaP | 7 | |
| p | AlGaAs | 5 | |
| p | AlInP | C15 | |
| p | InGaP | C14 | C1 |
| n | InGaP | C13 | |
| n | AlInP | C12 | |
| n | GaAs | C11 | |
| n | InGaP | 3 | |
| n | GaAs | 1 | |

| n | InP | C34 | |
|---|---|---|---|
| n | InGaAsP | C33 | C3,CA |
| p | InGaAsP | C32 | |
| p | InP | C31 | |
| InP SUBSTRATE | | 30 | |

COMPOUND SOLAR BATTERY AND MANUFACTURING METHOD THEREOF

This nonprovisional application is based on Japanese Patent Applications Nos. 2003-115360 and 2003-123328 filed with the Japan Patent Office on Apr. 21, 2003 and Apr. 28, 2003, respectively, the entire contents of which are hereby incorporated by reference.

BACKGROUND OF THE INVENTION

1. Field of the Invention

The present invention relates to a compound solar battery and manufacturing method thereof and, more specifically, to a multi-junction type compound solar battery and manufacturing method thereof 2. Description of the Background Art A multi-junction type III-V group compound solar battery has been known as a solar battery having highest efficiency and most suitable for aerospace applications among solar batteries. An exemplary method of manufacturing such a multi-junction type III-V group compound solar battery will be described in the following.

First, referring to FIG. 34, a Ge substrate (or a GaAs substrate) 101 is used as a substrate. On a surface of the substrate 101 of Ge or the like, Ge is epitaxially grown and $AsH_3$ or $PH_3$ is added to cause thermal diffusion of As or P, so that a bottom cell BB including a pn-junction of Ge is formed.

On the bottom cell BB, GaAs is epitaxially grown, so that a middle cell MM including a pn-junction of GaAs is formed. On the middle cell MM, InGaP is epitaxially grown, so that a top cell TT including a pn-junction of InGaP is formed.

In this manner, a 3-junction type III-V group compound solar battery 110 having a cell body CC is formed, in which three pn-junctions of Ge/GaAs/InGaP are connected in series in this order from the lower side on Ge substrate 101.

A forbidden band width (band gap) of InGaP forming the top cell TT is about 1.7 to about 2.1 eV, a forbidden band width (band gap) of GaAs as the middle cell is about 1.3 to about 1.6 eV, and a forbidden band width (band gap) of Ge as the bottom cell is about 0.7 eV or lower.

Sunlight enters from the side of top cell TT (InGaP) and proceeds toward the bottom cell BB (Ge), while light of prescribed wavelength is absorbed in accordance with the band gap of each of the top cell TT, middle cell MM and bottom cell BB, to be converted to electric energy.

The value of the band gap (about 0.7 eV or lower) of Ge as the bottom cell is relatively small considering the function of converting optical energy to electric energy. Therefore, use of a material having band gap of about 0.9 to about 1.1 eV has been proposed, as a material having higher conversion efficiency.

Reference 1 (M. Tamura et al., "Threading dislocations in $In_xGa_{1-x}As$/GaAs heterostructures", J. Appl. Phys. 72(8), Oct. 15, 1992, p. 3398) proposes InGaAs as one such material. In a multi-junction type solar battery 110 using InGaAs in place of Ge (see FIG. 35), on Ge substrate (or GaAs substrate) 101, a bottom cell NN including a pn-junction of InGaAs is formed by epitaxial growth On the bottom cell NN, the middle cell MM including the pn-junction of GaAs and the top cell TT including the pn-junction of InGaP would be formed by epitaxial growth, respectively.

Reference 2 (J. F. Geisz et al., "Photocurrent of 1 eV GaInNAs lattice-matched to GaAs", J. Crystal Growth 195 (1998), p. 401) proposes, in addition to InGaAs, InGaAsN as a material to replace Ge.

Multi-junction type solar battery 110 having the bottom cell NN employing InGaAs or InGaAsN in place of Ge, however, has the following problems.

First, in a multi-junction type solar battery employing InGaAs (0.9 to 1.1 eV) as the bottom cell NN, lattice constant of Ge substrate (or GaAs substrate) 101 is different from that of InGaAs. Therefore, epitaxially grown InGaAs comes to have a dislocation derived from the difference in lattice constant from the underlying layer (GaAs substrate or the like) (hereinafter referred to as a "misfit dislocation").

In the multi-junction type solar battery employing InGaAsN as the bottom cell, a composition of N atoms will be controlled such that the lattice constant of InGaAsN matches the lattice constant of the underlying layer. Therefore, generation of misfit dislocation can be prevented in the epitaxially grown InGaAsN.

It is noted, however, that there would be holes and the like of added N atoms themselves. As a result, the epitaxially grown InGaAsN comes to have defects derived from N atoms.

As described above, the bottom cell formed of InGaAs or InGaAsN suffers from generation of misfit dislocation or defects, and therefore it does not have satisfactory cell quality. Accordingly, desired electricity production cannot be attained.

Further, the misfit dislocation or defects in the bottom cell NN has undesirable influence on GaAs as the middle cell MM epitaxially formed on the bottom cell NN and on InGaP as the top cell TT further formed thereon.

Consequently, cell quality of GaAs and InGaP is also degraded, preventing improvement in efficiency of electric energy conversion.

As described above, sunlight enters from the top cell TT and proceeds to bottom cell BB while light of a prescribed wavelength is absorbed and converted to electric energy.

At this time, component of the sunlight that is not absorbed by the top cell TT to bottom cell BB is eventually absorbed by Ge substrate (or GaAs substrate) 101 and hence that component cannot effectively contribute to generation of power.

As a result, improvement in efficiency of electric energy conversion is prevented.

BRIEF SUMMARY

The present technology was made in order to solve the above described problems, and an object is to provide a compound solar battery that can improve efficiency of conversion to electric energy, and another object is to provide a method of manufacturing such a compound solar battery.

According to an aspect, the present technology provides a compound solar battery including a cell body, a first electrode portion and a second electrode portion. The cell body has at least one pn-junction layer of single crystal, and sunlight enters thereto. The first electrode portion is formed directly on that surface of the cell body which is opposite to the sunlight entering side, and has a prescribed thickness to support the cell body. The second electrode portion is formed on a surface of sunlight entering side of the cell body.

In this structure, the first electrode portion is formed directly on that side of the cell body which is opposite to the sunlight entering side. Thus, different from the conventional structure in which a prescribed substrate is arranged for epitaxial growth on that side of the cell body which is opposite to the sunlight entering side, the component of sunlight that enters the cell body but not absorbed by the cell body is reflected by the first electrode portion. As a result, the effect of light confinement improves, and the conversion efficiency of the compound solar battery can be improved.

Preferably, the cell body and the first electrode portion are flexible, or the first electrode portion preferably has such a thickness that allows deflection.

Accordingly, the compound solar battery comes to have higher degree of freedom in its shape.

As to more specific structure of the body, preferably the cell body includes a plurality of pn-junction layers of compounds having mutually different band gaps, and preferably, the plurality of pn-junctions are arranged such that the band gaps are made higher from the side of the first electrode portion to the sunlight entering side.

More specifically, the plurality of pn-junction layers preferably include a first pn-junction layer of a III-V group compound having a first band gap formed on the first electrode portion and a second pn-junction of a III-III-V group compound having a second band gap higher than the first band gap formed on the first pn-junction layer.

Alternatively, the plurality of pn-junction layers preferably include a first pn-junction layer of a III-III-V group compound having a first band gap formed on the first electrode portion, a second pn-junction layer of a III-V group compound having a second band gap higher than the first band gap formed on the first pn-junction layer, and a third pn-junction layer of a III-III-V group compound having a third band gap higher than the second band gap formed on the second pn-junction layer.

Alternatively, the plurality of pn-junction layers preferably include a first pn-junction layer containing a I-III-VI group compound having a first band gap formed on the first electrode portion, a second pn-junction layer of a III-III-V group compound having a second band gap higher than the first band gap formed on the first pn-junction layer, and a third pn-junction layer of III-III-V group compound having a third band gap higher than the second band gap formed on the second pn-junction layer. Here, I, III, V and VI groups represent groups of the periodic table.

Further, besides the cell body, another cell body may be provided adhered on that side of the first electrode portion which is opposite to the sunlight entering side, and in that case, the first electrode portion is preferably formed of a transparent conductive film.

More specifically, the cell body preferably has pn-junction layers arranged such that the band gap becomes higher from the side of the first electrode portion to the side of the second electrode portion to which sunlight enters, and the aforementioned another cell body preferably has a pn-junction layer that has lower band gap than that of the cell body.

More specifically, the cell body preferably includes a pn-junction layer of a III-V group compound having a first band gap and a pn-junction layer of a III-III-V group compound having a second band gap higher than the first band gap, and another cell body preferably includes a pn-junction layer of a III-III-V group compound having a third band gap lower than the first band gap.

Preferably, the pn-junction layer of the aforementioned another cell body includes a pn-junction of a I-III-VI group compound.

Alternatively, the cell body preferably includes a pn-junction layer of a III-V group compound having a first band gap arranged on the side opposite to the sunlight entering side and a pn-junction layer of a III-III-V group compound having a second band gap higher than the first band gap arranged on the sunlight entering side, and the aforementioned another cell body is preferably formed of a silicon solar battery cell.

According to another aspect, the present technology provides a method of manufacturing a compound solar battery including the following steps. On a surface of a semiconductor substrate, a layer to be a first cell having a first band gap is formed by epitaxial growth. On the layer to be the first cell, a layer to be a second cell having a second band gap lower than the first band gap is formed. On the layer to be the second cell, a first electrode portion having a prescribed thickness to support the layers to be the first and second cells is directly formed. The layer to be the first cell is separated from the semiconductor substrate. On that surface of the layer to be the first cell which is exposed by separation from the semiconductor substrate, a second electrode portion is formed.

According to this manufacturing method, the layer to be the first cell, which will be positioned to the sunlight entering side in the finished state is formed first on the semiconductor substrate, and the layer to be the second cell, which will be positioned to the side opposite to the sunlight entering side, is formed later. Therefore, even when a material having relatively high band gap as the second band gap is used for the layer to be the second cell, the quality of the layer to be the second cell does not affect the layer to be the first cell. Further, as the first electrode portion is formed directly on the layer to be the second cell, the component of sunlight that is not absorbed by the layers to be the first and second cells is reflected by the first electrode portion. This improves the effect of light confinement. As a result, conversion efficiency of the compound solar battery can be improved.

Preferably, the manufacturing method further includes, between the step of forming the layer to be the first cell and the step of forming the layer to be the second cell, a step of forming a layer to be a third cell having a third band gap lower than the first band gap and higher than the second band gap.

Thus, components of the sunlight having prescribed wavelengths are absorbed by the respective layers to be the cells in accordance with respective band gaps, and therefore conversion efficiency can further be improved.

Preferably, the manufacturing method specifically includes, in order to separate the semiconductor substrate, a step of forming a prescribed intermediate layer by epitaxial growth between the layer to be the first cell and the semiconductor substrate, and the step of separating the layer to be the first cell from the semiconductor substrate includes the step of removing the semiconductor substrate by etching and further removing the intermediate layer.

Alternatively, the manufacturing method preferably includes the step of forming a prescribed intermediate layer by epitaxial growth between the layer to be the first cell and the semiconductor substrate, and the step of separating the layer to be the first cell from the semiconductor substrate includes the step of removing the intermediate layer by etching so as to detach the semiconductor substrate.

By this step, it becomes possible to reuse the semiconductor substrate.

Preferably, in the step of forming the first electrode portion, the first electrode portion is formed of a transparent conductive film, and the manufacturing method further includes, after the step of forming the first electrode and before the step of separating the first layer from the semiconductor substrate, the step of adhering, to the first electrode portion, the layer to be the third cell having the third band gap lower than the second band gap.

In this case also, components of the sunlight having prescribed wavelengths are absorbed by the respective layers to be the cells in accordance with respective band gaps, and therefore conversion efficiency can be improved.

In order to separate the semiconductor substrate, an intermediate layer may be formed and the semiconductor substrate may be removed by etching, or the intermediate layer may be removed by etching and the semiconductor substrate may be detached, as described above. Particularly, when the semiconductor substrate is detached, it becomes possible to reuse the semiconductor substrate.

Preferably, the step of adhering the layer to be the third cell to the first electrode portion specifically includes the step of forming a transparent conductive film on a surface of the third cell and adhering the third cell to the first electrode portion by a transparent conductive adhesive.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A compound solar battery in accordance with a first example embodiment will be described. A 2-junction type compound solar battery having a bottom cell and a top cell will be described as an example of the cell body of the compound solar battery.

First, the manufacturing method will be described. As a substrate, a GaAs substrate ($1\times10^{18}$ cm$^{-3}$, Si doped, 50 mm in diameter) is prepared. The GaAs substrate is put in a vertical MOCVD (Metal Organic Chemical Vapor Deposition) apparatus.

Figure 1:
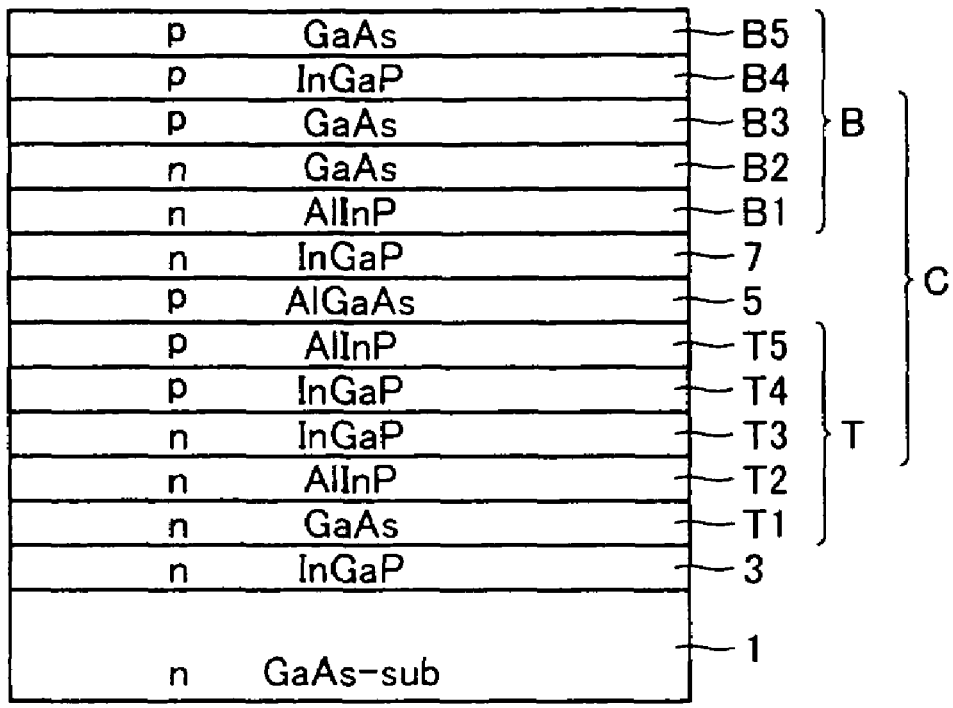
FIG. 1 is a cross section representing a step of manufacturing a compound solar battery in accordance with a first example embodiment.
Figure 2:
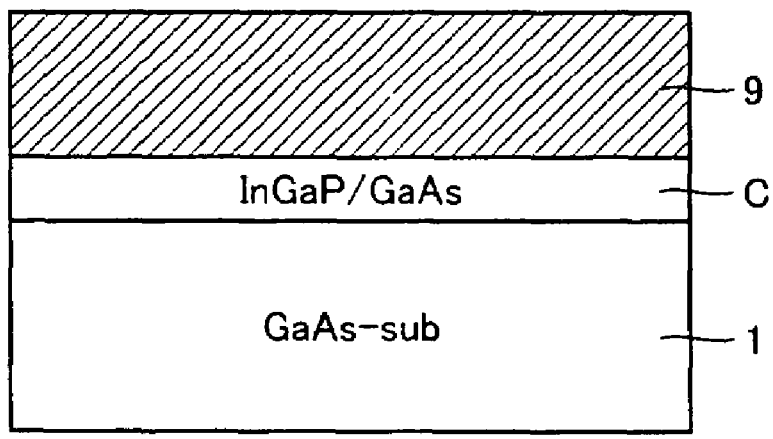
FIG. 2 is a cross section representing a step following the step shown in FIG. 1 in accordance with the first embodiment.

Thereafter, as shown in FIG. 1, an n-type InGaP layer 3 having the thickness of about 0.5 μm is formed by epitaxial growth on a surface of GaAs substrate 1. InGaP layer 3 will be an intermediate layer between a cell body that will be formed on InGaP layer 3 and GaAs substrate 1.

Thereafter, on InGaP layer 3, single crystal layers to be the top cell T are formed by epitaxial growth. Specifically, an n-type GaAs layer T1, an n-type AlInP layer T2, an n-type InGaP layer T3, a p-type InGaP layer T4 and a p-type AlInP layer T5 are formed successively.

Thereafter, on AlInP layer T5, a p-type AlGaAs layer 5 and an n-type InGaP layer 7 are successively formed by epitaxial growth, as a tunnel junction.

Thereafter, on n-type InGaP layer 7, various single crystal layers to be the bottom cell B are formed by epitaxial growth. Specifically, an n-type AlInP layer B1, an n-type GaAs layer B2, a p-type GaAs layer B3, a p-type InGaP layer B4 and a p-type GaAs layer B5 are formed successively.

As to the condition of epitaxial growth, temperature is set to about 700° C. TMG (trimethyl gallium) and AsH$_3$ (arsine) are used as materials for growing the GaAs layer.

TMI (trimethyl indium), TMG and PH$_3$ (phosphine) are used as materials for growing the InGaP layer. TMA (trimethyl aluminum), TMI and PH$_3$ are used as materials for growing the AlInP layer.

As an impurity for forming n-type GaAs layer, InGaP layer and AlInP layer, SiH$_4$ (monosilane) is used. As an impurity for forming p-type GaAs layer, InGaP layer and AlInP layer, DEZn (diethyl zinc) is used.

Further, TMI, TMG and AsH$_3$ are used as materials for growing AlGaAs layer, and as an impurity for forming p-type AlGaAs layer, CBr$_4$ (carbon tetra-bromide) is used.

In this manner, the cell body C of a compound solar battery having a top cell T and a bottom cell B is formed.

Thereafter, on a surface of cell body C (p-type GaAs layer of the bottom cell), an Au—Zn film (not shown) is vapor-deposited. Thereafter, in a nitrogen atmosphere, heat treatment of about one minute is performed at a temperature of about 400° C.

Thereafter, a resist (not shown) is applied and thermally cured on a back surface of GaAs substrate 1. Then, by electrolytic plating, an Au plated layer having the thickness of about 30 µm is formed on the Au—Zn film.

In this manner, a back surface electrode 9 of Au plated film is formed on the cell body C. Thereafter, the resist formed on the back surface of GaAs substrate 1 is removed.

Thereafter, as a protection at the time of etching, wax 11, for example, is applied to back surface electrode 9, and a glass plate 13 and back surface electrode 9 are temporarily adhered together for easier handling. Thereafter, GaAs substrate 1 supported by glass substrate 13 is dipped in an alkali solution such as ammonia water, and GaAs substrate 1 is removed.

Here, GaAs substrate 1 having the thickness of about 350 µm is fully etched and removed by keeping dipped in an alkali solution for about 300 minutes. Etching is stopped when InGaP layer 3 as the intermediate layer is exposed.

At this time, GaAs substrate 1 supported by glass substrate 13 may be dipped in an acid solution such as HCl to etch InGaP layer 3 as the intermediate layer, so as to remove GaAs substrate 1.

Figure 3:
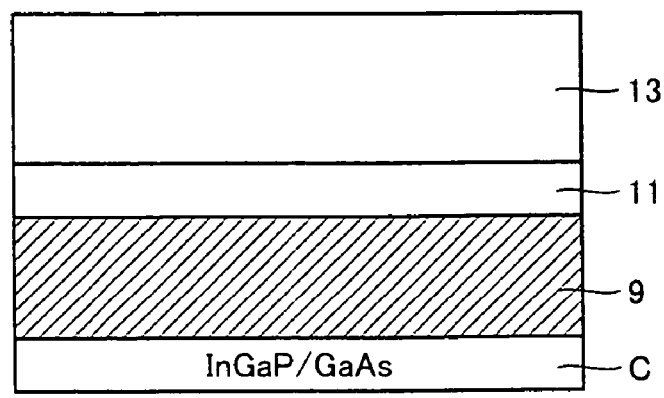
FIG. 3 is a cross section representing a step following the step shown in FIG. 2 in accordance with the first embodiment.

Thereafter, by etching with an acid solution, InGaP layer 3 as the exposed intermediate layer is removed, and n-type GaAs layer T1 of top cell T is exposed. In this manner, the surface of cell body C (specifically, top cell T) comes to be exposed as shown in FIG. 3.

Thereafter, by photolithography, a prescribed resist pattern (not shown) for forming a surface electrode is formed on the exposed surface of cell body C (top cell).

Thereafter, cell body C with the resist pattern formed thereon is introduced to a vacuum vapor deposition apparatus (not shown) together with glass substrate 13. By resistance heating method, an Au film (containing 12% by weight of Ge) having the thickness of about 100 nm (not shown) is formed to cover the resist pattern.

Thereafter, by EB (Electron Beam) vapor deposition method, an Ni layer having the thickness of about 20 nm and an Au layer having the thickness of about 5000 nm (both not shown) are formed continuously.

Figure 4:
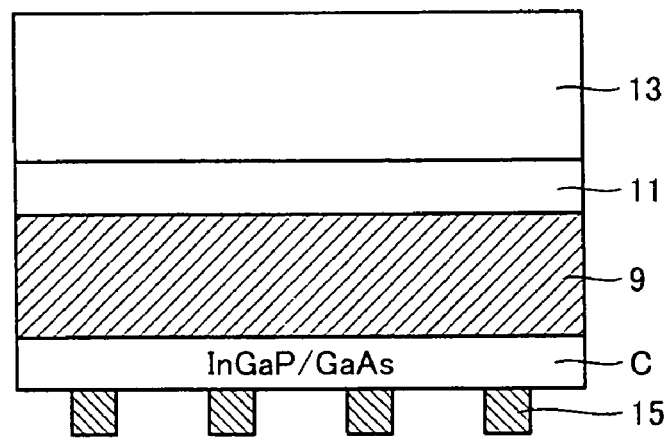
FIG. 4 is a cross section representing a step following the step shown in FIG. 3 in accordance with the first embodiment.

Thereafter, by lift-off method, the resist pattern and the Au film and the like formed on the resist pattern are removed. In this manner, surface electrode 15 is formed as shown in FIG. 4.

Figure 6:
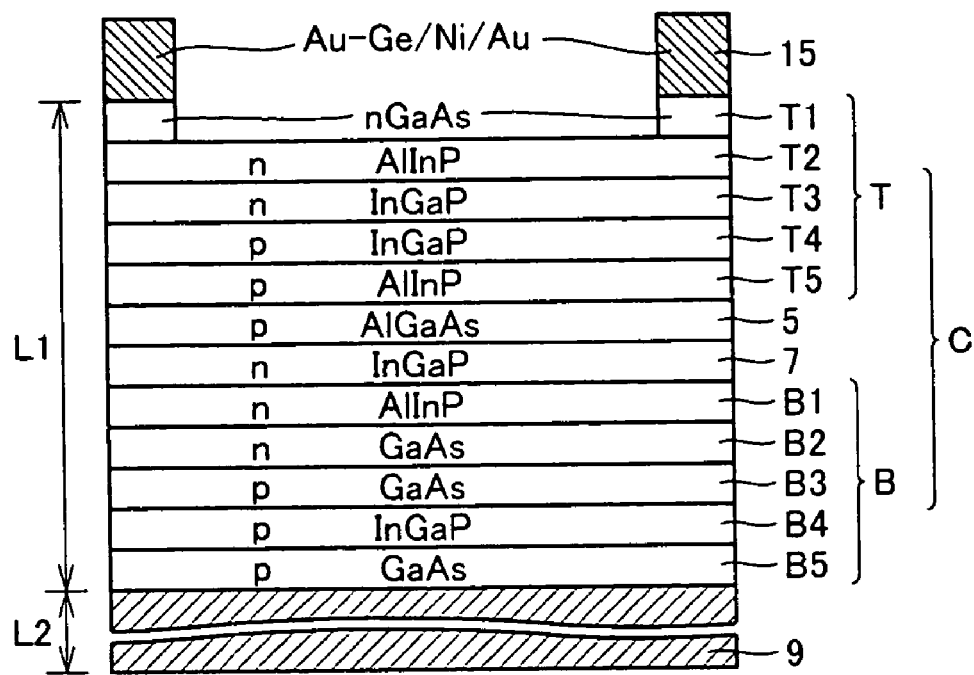
FIG. 6 is a cross section representing a step following the step shown in FIG. 5 in accordance with the first embodiment.
Figure 7:
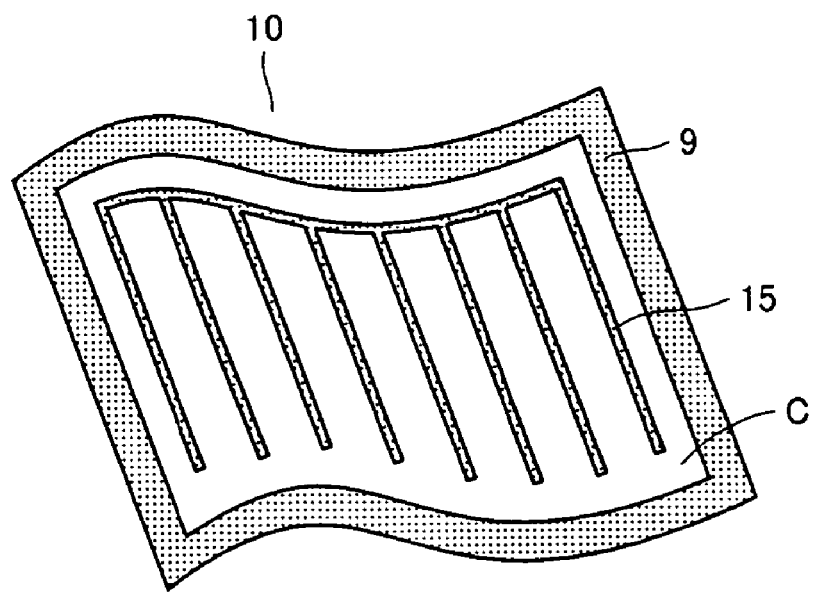
FIG. 7 is a perspective view showing an appearance of the finished compound solar battery in accordance with the first embodiment.

Thereafter, using surface electrode 15 as a mask, etching with alkali solution is performed to remove exposed GaAs layer, and the AlInP layer is exposed (see FIG. 6).

Thereafter, a prescribed resist pattern (not shown) for mesa etching is formed to cover surface electrode 15. Using the resist pattern as a mask, etching with an alkali solution and an acid solution is performed, so that the Au plated film serving as back surface electrode 9 is exposed.

Figure 5:
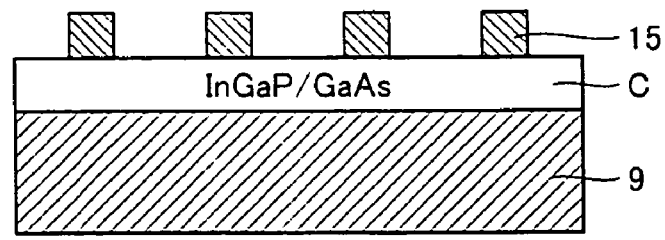
FIG. 5 is a cross section representing a step following the step shown in FIG. 4 in accordance with the first embodiment.

Next, by EB vapor deposition method, a TiO$_2$ film having the thickness of about 55 nm and an MgF$_2$ film having the thickness of about 100 nm (both not shown) are formed successively as anti-reflection films, on the sunlight entering side (surface). Thereafter, by removing wax 11 using toluene, for example, glass substrate 13 is separated from back surface electrode 9, as shown in FIG. 5.

Thereafter, by cutting the Au plated film along the exposed line-shaped Au plated film, twelve compound solar batteries having the size of 10 mm×10 mm, by way of example, are fabricated.

Figure 34:
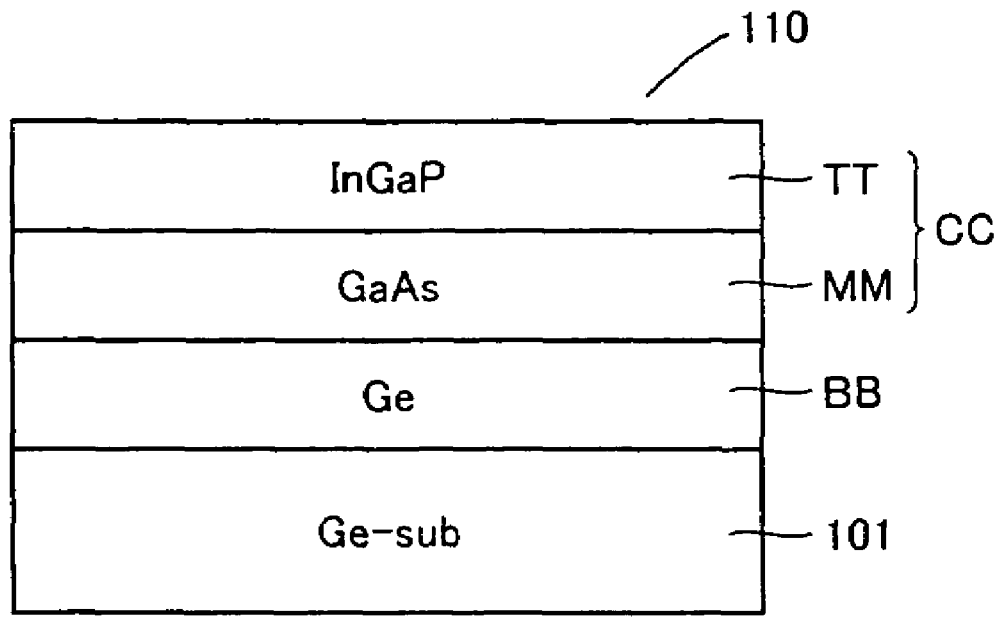
FIG. 34 is a cross section representing a conventional solar battery.
Figure 35:
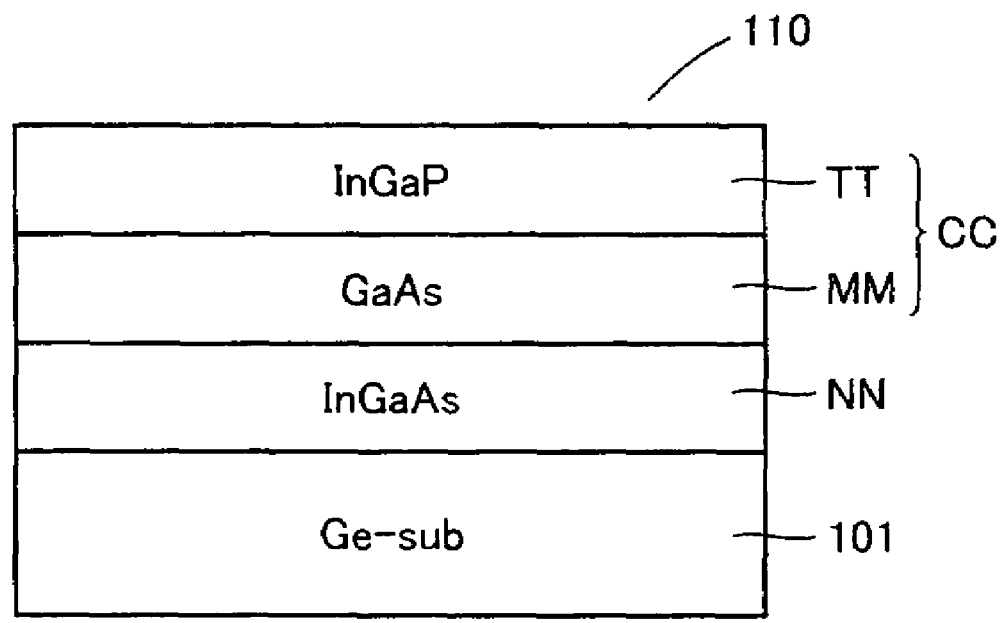
FIG. 35 is a cross section representing another conventional solar battery.

FIG. 6 shows a cross-sectional structure of the compound solar battery manufactured in this manner. As shown in FIG. 6, as compared with the structure of the conventional solar battery having the bottom cell formed on a prescribed substrate for epitaxial growth (see, for example, FIG. 34 or 35), the present compound solar battery has the back surface electrode 9 formed directly on the bottom cell B of cell body C. Further, surface electrode 15 is formed on the surface of top cell T of cell body C.

Cell body C includes bottom cell B having a pn-junction of GaAs (III-V group compound) and top cell T having a pn-junction of InGaP (III-III-V group compound).

Thickness L1 of cell body C is about 4 µm, and thickness L2 of back surface electrode 9 is about 30 µm. Namely, cell body C and back surface electrode 9 are thin enough to have flexibility, and hence, compound solar battery 10 can freely be deflected.

In the compound solar battery described above, on GaAs substrate 1 for epitaxial growth, layers to be the top cell T are successively formed by epitaxial growth, and on the top cell T, layers to be the bottom cell B are formed.

Thereafter, GaAs substrate 1 is separated from cell body C, back surface electrode 9 is directly formed on bottom cell B, and cell body C comes to be supported by back surface electrode 9. As back surface electrode 9 is directly formed on the surface of bottom cell B, the effect of light confinement when the sunlight enters can be improved.

Figure 8:
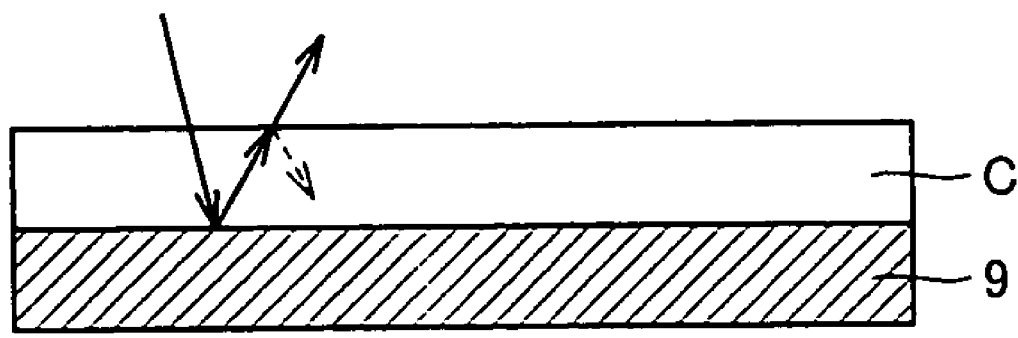
FIG. 8 is a partial sectional view illustrating the effect of the compound solar battery in accordance with the first embodiment.

Specifically, as shown in FIG. 8, in the compound solar battery described above, components of the sunlight that have not been absorbed by cell body C while passing through cell body C are eventually reflected by back surface electrode 9. Therefore, the effect of light confinement of cell body C is improved, and the components of sunlight that are reflected by back surface electrode 9 contribute to power generation. As a result, conversion efficiency of the solar battery cell can be improved.

Figure 9:
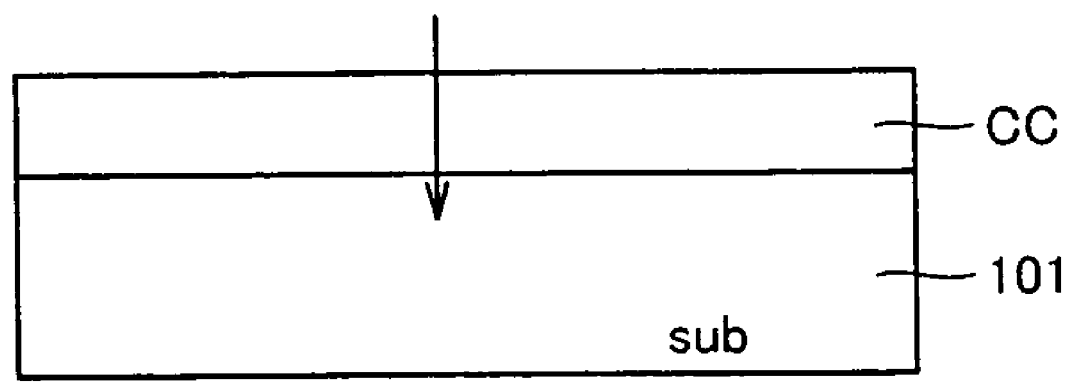
FIG. 9 is a partial sectional view showing a function of a comparative compound solar battery, to demonstrate the effect of the compound solar battery in accordance with the first embodiment.

In contrast, in the conventional compound solar battery, on the bottom cell side of cell body CC, substrate 101 for epitaxial growth is positioned, as shown in FIG. 9. Therefore, components of sunlight that have not been absorbed by cell body CC while passing through cell body CC are absorbed by substrate 101, and therefore, these components do not contribute to power generation.

The solar battery cell described above was evaluated using a solar simulator. The result will be described. The solar simulator refers to a radiation light source used for indoor testing of characteristics and reliability of a solar battery, and required radiation illumination, uniformity and spectrum matching are satisfied in accordance with the object of testing.

First, as the radiation light source, a reference sunlight having air mass (AM) of 1.5 G was used, and current-voltage characteristic at the time of irradiation was measured. Based on the current-voltage characteristic, short circuit current, open circuit voltage, fill factor and conversion efficiency are calculated.

Here, air mass refers to a ratio of the path length of sunlight directly incident on the earth with respect to path length of sunlight vertically entering the atmosphere in the standard condition (standard atmospheric pressure of 1013 hPa).

The short circuit current refers to the current flowing between two output terminals when the output terminals of the solar battery cell (module) are short-circuited. The open circuit voltage refers to the voltage between the two output terminals when the output terminals of the solar battery cell (module) are opened.

The fill factor refers to a value obtained by dividing maximum output by a product of open circuit voltage and short circuit current. The conversion efficiency refers to a value (%) obtained by dividing the maximum output by a product of the area of solar battery cell (module) and radiation luminance.

Figure 10:
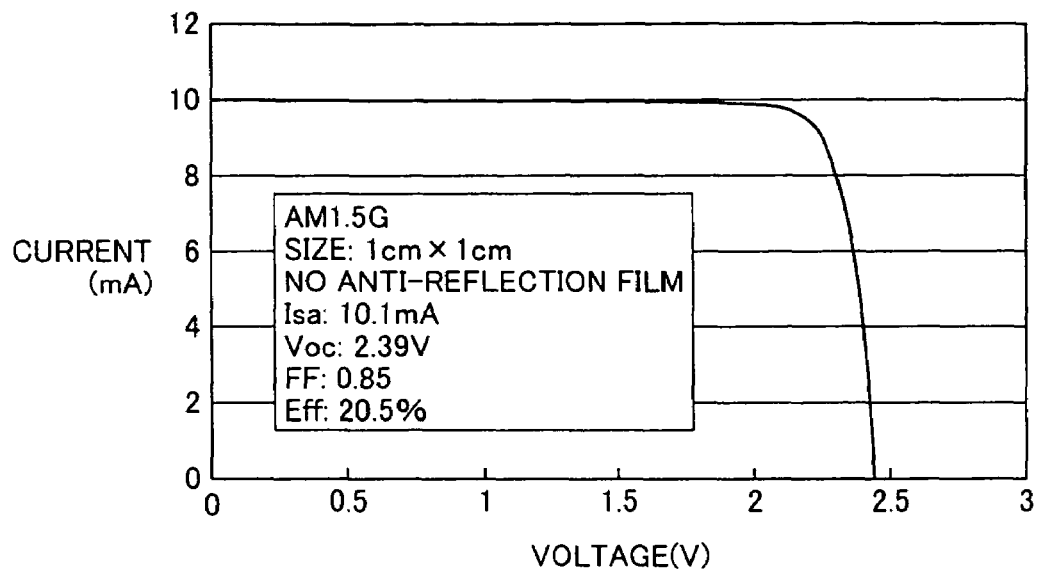
FIG. 10 represents current-voltage characteristic of the compound solar battery in accordance with the first embodiment, obtained by a solar simulator.

FIG. 10 shows the measured current-voltage characteristic (I-V curve). Here, the short circuit current was 10.1 mA, open circuit voltage was 2.39 V, fill factor was 0.85, and conversion efficiency was 20.5%.

From the foregoing, it was found that compared with the conventional 2-junction type compound solar battery having two pn-junctions of InGaAs and GaAs formed on a GaAs substrate, the present compound solar battery described above attained comparative or better results.

Second Embodiment

Here, in order to confirm the effect of light confinement attained by the back surface electrode, a compound solar battery having a cell body structure different from the one described above was evaluated as an example. This will be described in the following.

Figure 11:
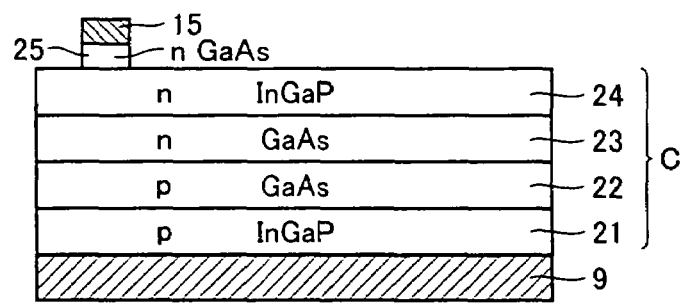
FIG. 11 is a cross section representing a compound solar battery in accordance with a second example embodiment.
Figure 12:
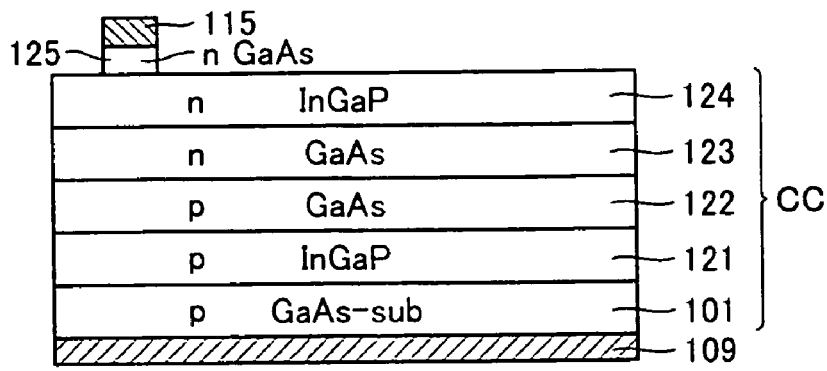
FIG. 12 is a cross section of a comparative compound solar battery, to demonstrate the effect of the compound solar battery in accordance with the second embodiment.

First, as shown in FIG. 11, in the compound solar battery in accordance with the present embodiment, cell body C is directly formed on the surface of back surface electrode 9. In cell body C, a p-type InGaP layer 21 is formed on back surface electrode 9. On InGaP layer 21, a p-type GaAs layer 22 is formed.

On GaAs layer 22, an n-type GaAs layer 23 is formed. On GaAs layer 23, an n-type InGaP layer 24 is formed. At a prescribed position on InGaP layer 24, a surface electrode 15 is formed, with a contact of n-type GaAs layer interposed.

The compound solar battery is formed through the method similar to that of the compound solar battery described above.

Specifically, first, layers from n-type GaAs layer 25 to p-type InGaP layer 21 are successively formed on a prescribed substrate (not shown). Thereafter, back surface electrode 9 is formed on the side of the bottom cell, and the substrate is separated.

In contrast, in the comparative compound solar battery, on a surface of p-type GaAs substrate 101, a p-type InGaP layer 121 is formed. On InGaP layer 121, a p-type GaAs layer 122 is formed.

On GaAs layer 122, an n-type GaAs layer 123 is formed. On GaAs layer 123, an n-type InGaP layer 124 is formed. At a prescribed position on InGaP layer 124, a surface electrode 115 is formed, with a contact of n-type GaAs layer 125 interposed.

The comparative compound solar battery is formed by successively growing various layers through epitaxial growth, on a p-type GaAs substrate 101.

The compound solar battery described above and the comparative solar battery are evaluated by using the solar simulator described above. In the compound solar battery in accordance with the present embodiment, the short circuit current was 19 mA, open circuit voltage was 1.03 V, fill factor was 0.84 and conversion efficiency was 16.4%.

In contrast, in the comparative compound solar battery, the short circuit current was 15 mA, open circuit voltage was 1.03 V, fill factor was 0.84 and conversion efficiency was 13.0%.

As can be seen from above, in the compound solar battery in accordance with the present embodiment, the conversion efficiency is particularly improved as compared with the comparative compound solar battery, and thus, it was found that the effect of light confinement by back surface electrode 9 could be improved.

Third Embodiment

A compound solar battery in accordance with a third embodiment will be described. Here, by way of example, a 3-junction type compound solar battery having a bottom cell, middle cell and top cell as the cell body of the compound solar battery will be described.

First, manufacturing method will be described. As a substrate, a GaAs substrate ($1 \times 10^{18}$ cm$^{-3}$, Si doped, 50 mm in diameter) is prepared. The GaAs substrate is put in a vertical MOCVD apparatus.

Figure 13:
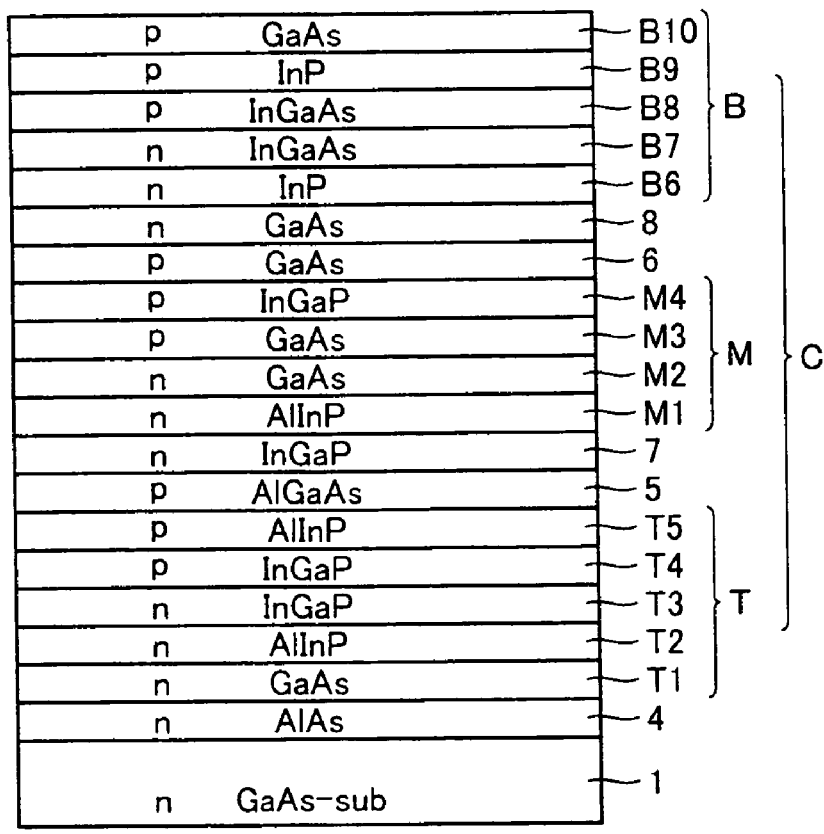
FIG. 13 is a cross section representing a step of manufacturing a compound solar battery in accordance with a third example embodiment.

Then, as shown in FIG. 13, on GaAs substrate 1, an n-type AlAs layer 4 to be the intermediate layer, having the thickness of about 0.5 μm is formed by epitaxial growth.

On AlAs layer 4, layers to be the top cell T are formed by epitaxial growth. Specifically, an n-type GaAs layer T1, an n-type AlInP layer T2, an n-type InGaP layer T3, a p-type InGaP layer T4 and a p-type AlInP layer T5 are formed successively.

Thereafter, as a tunnel junction, on AlInP layer 5, a p-type AlGaAs layer 5 and n-type InGaP layer 7 are successively formed.

Thereafter, on n-type InGaP layer 7, layers to be the middle cell M are formed by epitaxial growth. Specifically, an n-type AlInP layer M1, an n-type GaAs layer M2, a p-type GaAs layer M3 and p-type InGaP layer M4 are successively formed.

Thereafter, on p-type InGaP layer M4, as a tunnel junction, a p-type GaAs layer 6 and an n-type GaAs layer 8 are successively formed by epitaxial growth.

Thereafter, on n-type GaAs layer 8, layers to be the bottom cell B are formed by epitaxial growth. Specifically, an n-type InP layer B6, an n-type InGaAs layer B7, a p-type InGaAs layer B8, a p-type InP layer B9 and a p-type GaAs layer B10 are successively formed.

As to the condition of epitaxial growth, temperature is set to about 700° C. TMG (trimethyl gallium) and $AsH_3$ (arsine) are used as materials for growing the GaAs layer.

TMI (trimethyl indium), TMG and $PH_3$ (phosphine) are used as materials for growing the InGaP layer. TMA (trimethyl aluminum), TMI and $PH_3$ are used as materials for growing the AlInP layer.

As an impurity for forming n-type GaAs layer, InGaP layer and AlInP layer, $SiH_4$ (monosilane) is used. As an impurity for forming p-type GaAs layer, InGaP layer and AlInP layer, DEZn (diethyl zinc) is used.

Further, TMI, TMG and $AsH_3$ are used as materials for growing AlGaAs layer, and as an impurity for forming p-type AlGaAs layer, $CBr_4$ (carbon tetra-bromide) is used.

Composition ratio of In in InGaAs layer is 0.25, and on the InGaAs layer, a morphology of cross-hatch pattern indicating presence of misfit dislocation was observed.

In this manner, the cell body C of a 3-junction type compound solar battery including top cell T, middle cell M and bottom cell B is formed.

On the surface of cell body C (p-type GaAs layer of the bottom cell), a resist pattern (not shown) for forming the back surface electrode is formed. An Au—Zn film (not shown) is vapor-deposited to cover the resist pattern.

Thereafter, by the lift-off method, the resist pattern and the Au—Zn film positioned on the resist pattern are removed. Thereafter, in a nitrogen atmosphere, heat treatment of about 1 minute is performed at a temperature of about 400° C.

Then, except for the regions where the Au—Zn film is formed, a prescribed resist pattern (not shown) is formed. Further, on a surface of GaAs substrate 1 on the side where cell body C is not formed, a resist (not shown) is applied.

Figure 14:
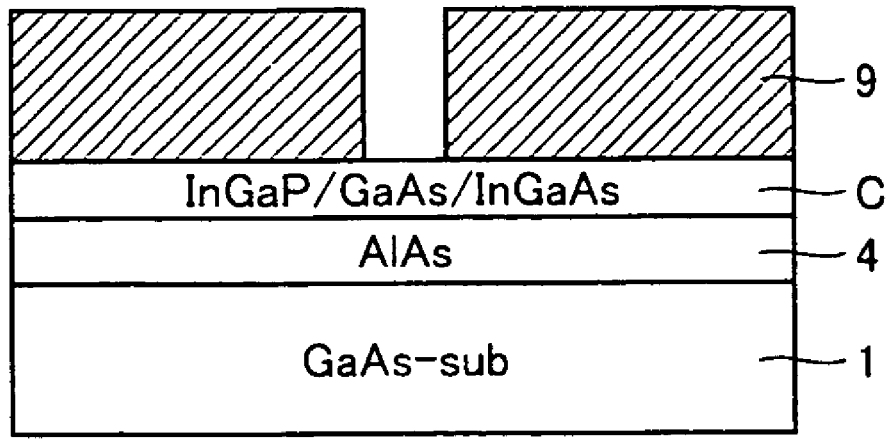
FIG. 14 is a cross section representing a step following the step shown in FIG. 13 in accordance with the third embodiment.

Thereafter, an Au plated film (not shown) having the thickness of about 30 μm is formed on the Au—Zn film, by electrolytic plating. Thereafter, by the lift-off method, the resist pattern and the Au plated film positioned on the resist pattern are removed. Consequently, back surface electrode 9 of Au plated film is formed on the cell body, as shown in FIG. 14.

Figure 15:
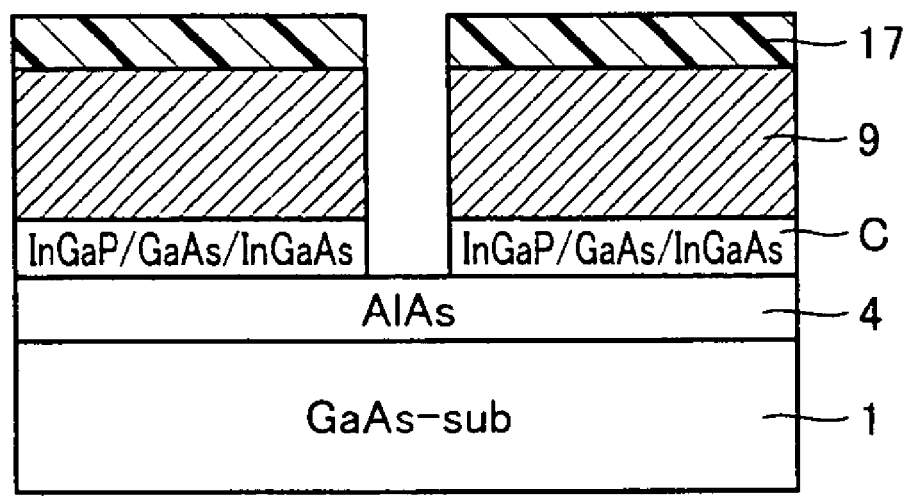
FIG. 15 is a cross section representing a step following the step shown in FIG. 14 in accordance with the third embodiment.

Thereafter, a prescribed resist pattern 17 is formed to cover back surface electrode 9 in a region where back surface electrode 9 is formed and to expose the surface of cell body C in a region where back surface electrode 9 is not formed, as shown in FIG. 15.

Using the resist pattern 17 as a mask, etching with an alkali solution and an acid solution is performed, so that the portion of the exposed cell body C is removed and AlAs layer 3 as the intermediate layer is exposed. Thereafter, resist pattern 17 is removed.

Figure 16:
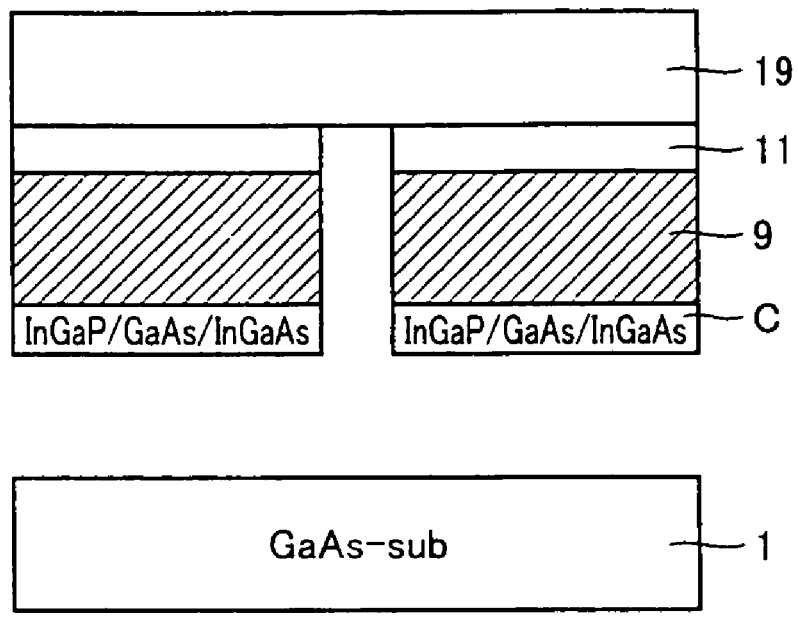
FIG. 16 is a cross section representing a step following the step shown in FIG. 15 in accordance with the third embodiment.

Thereafter, a mesh-shaped resin plate 19 having chemical resistance is adhered to the side of back surface electrode 9, with wax 11 interposed (see FIG. 16). With resin plate 19 adhered on back surface electrode 9, the cell body C and back surface electrode 9 are dipped in a hydrofluoric acid solution.

Dipped in the hydrofluoric acid solution, AlAs layer 4 is removed, and therefore, the cell body C is separated from GaAs substrate 1. In this manner, GaAs substrate 1 is separated and the n-type GaAs layer of the top cell T of cell body C is exposed.

Thereafter, on the exposed surface of GaAs layer, a prescribed resist pattern for forming a surface electrode (not shown) is formed. Thereafter, cell body C with the resist pattern formed thereon is introduced to a vacuum vapor deposition apparatus (not shown) together with resin plate 19.

By resistance heating method, an Au film (containing 12% by weight of Ge) having the thickness of about 100 nm is formed to cover the resist pattern. Thereafter, by EB (Electron Beam) vapor deposition method, an Ni layer having the thickness of about 20 nm and an Au layer having the thickness of about 5000 nm (both not shown) are formed continuously.

Figure 17:
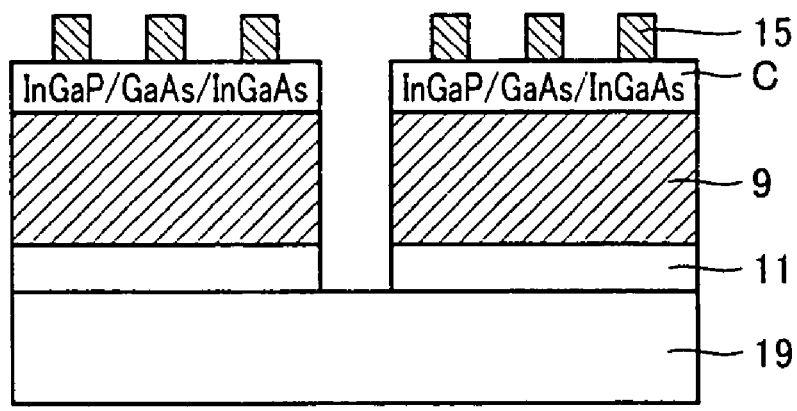
FIG. 17 is a cross section representing a step following the step shown in FIG. 16 in accordance with the third embodiment.

Thereafter, by lift-off method, the resist pattern and the Au film and the like formed on the resist pattern are removed. In this manner, surface electrode 15 is formed as shown in FIG. 17.

Figure 18:
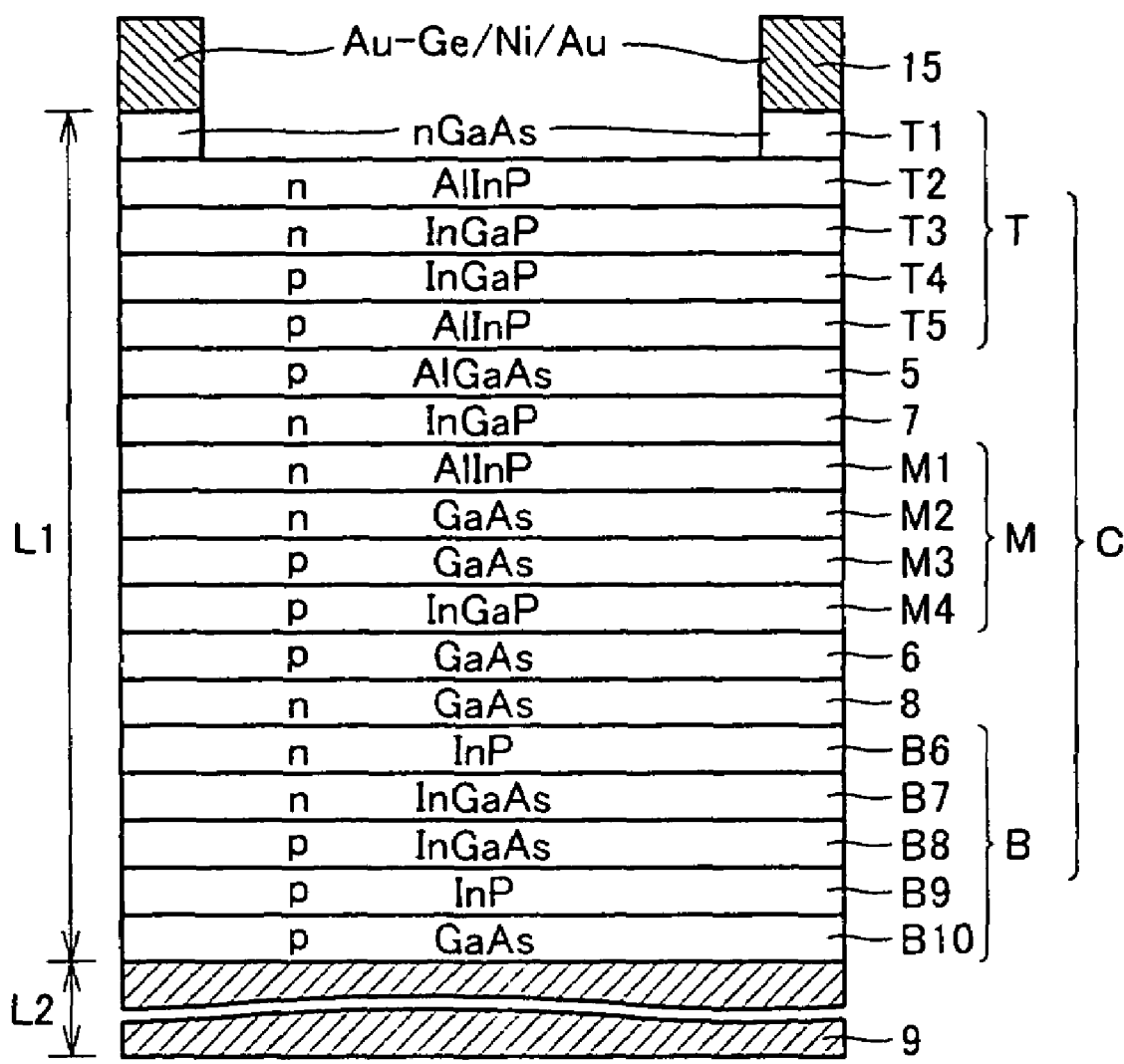
FIG. 18 is a cross section representing a step following the step shown in FIG. 17 in accordance with the third embodiment.

Thereafter, using surface electrode 15 as a mask, etching with alkali solution is performed to remove exposed GaAs layer, and the AlInP layer is exposed (see FIG. 18).

Next, by EB vapor deposition method, a $TiO_2$ film having the thickness of about 55 nm and an $MgF_2$ film having the thickness of about 100 nm (both not shown) are formed successively as anti-reflection films, on the sunlight entering side (surface). Thereafter, by removing wax 11 using toluene, for example, resin plate 19 is separated from back surface electrode 9, as shown in FIG. 18.

Thereafter, by cutting the Au plated film along the exposed line-shaped Au plated film, twelve compound solar batteries having the size of 10 mm×10 mm, by way of example, are fabricated.

FIG. 18 shows a cross-sectional structure of the compound solar battery manufactured in this manner. As shown in FIG. 18, as compared with the structure of the conventional solar battery having the bottom cell formed on a prescribed substrate for epitaxial growth (see, for example, FIG. 34 or 35), the present compound solar battery has the back surface electrode 9 formed directly on the bottom cell B of cell body C.

Further, surface electrode 15 is formed on the surface of top cell T of cell body C. Middle cell M is formed between top cell T and bottom cell B.

The cell body C includes a bottom cell having a pn-junction of InGaAs (III-III-V group compound), a middle cell M having a pn-junction of GaAs (III-V group compound) and a top cell T having a pn-junction of InGaP (III-III-V group compound).

Thickness L1 of cell body C is about 6 μm, and thickness L2 of back surface electrode 9 is about 30 μm. Namely, cell body C and back surface electrode 9 are thin enough to have flexibility, and hence, compound solar battery 10 can freely be deflected, as in the compound solar battery described above.

In the solar battery cell described above, on the GaAs substrate 1 for epitaxial growth, layers to be the top cell T having the band gap of about 1.7 to about 2.1 eV are successively formed by epitaxial growth.

Then, on the top cell T, layers to be the middle cell M having the band gap of about 1.3 to about 1.6 eV are successively formed. Further, on the middle cell M, layers to be the bottom cell B having the band gap of about 0.9 to 1.1 eV are successively formed.

In this manner, in the compound solar battery described above, layers to be the top cell T are formed first and the layers to be the bottom cell B are formed last.

Therefore, even when a material having larger band gap (about 0.9 to about 1.1 eV) than a conventional material (~0.7 eV) is used for the bottom cell B, the quality of the bottom cell B does not have any influence on the middle cell M and the top cell T, and the conversion efficiency of the compound solar battery can be improved. This will be described in detail in the following.

In the conventional method of manufacturing a compound solar battery, on the Ge substrate (or GaAs substrate) for epitaxial growth, layers to be the bottom cell are formed first, and layers to be the top cell are formed later.

Here, when InGaAs having a relatively high band gap (about 0.9 to about 1.1 eV) is applied as the material of the bottom cell, misfit dislocation results in the InGaAs layer, as the lattice constant of the Ge substrate (GaAs substrate) is different from that of InGaAs.

When InGaAsN is applied as the bottom cell, defects related to N atoms are generated in InGaAsN.

Such defects or misfit dislocation generated in the bottom cell affects the GaAs layer to be the middle cell epitaxially grown on the bottom cell as well as the InGaP layer to be the top cell.

Consequently, quality of the middle cell and the top cell is degraded, making it difficult to improve conversion efficiency of the compound solar battery.

In contrast, in the compound solar battery described above, layers to be the top cell and layers to be the middle cell are successively formed on the surface of GaAs substrate 1, and layers to be the bottom cell are formed last.

Here, lattice constant of InGaAs to be the bottom cell is different from that of GaAs to be the middle cell. Therefore, the quality of the bottom cell formed on the middle cell is comparative to that of the conventional compound solar battery.

On the other hand, lattice constant of InGaP to be the top cell and lattice constant of GaAs to be the middle cell are the same as lattice constant of GaAs substrate for epitaxial growth. Therefore, dislocation or defect is not generated in the InGaP and GaAs layers epitaxially grown successively on the GaAs substrate 1.

Specifically, in the compound solar battery described above, even when the quality of bottom cell B is comparative to the quality of bottom cell of the conventional compound solar battery, degradation in quality of the bottom cell does not have any influence on the middle cell M or top cell T, as the top cell T and middle cell M are formed earlier.

As a result, even when a material having relatively high band gap such as InGaAs is used for the bottom cell B, quality of the middle cell and the top cell is not degraded, and conversion efficiency of the compound solar battery can be improved.

Figure 19:
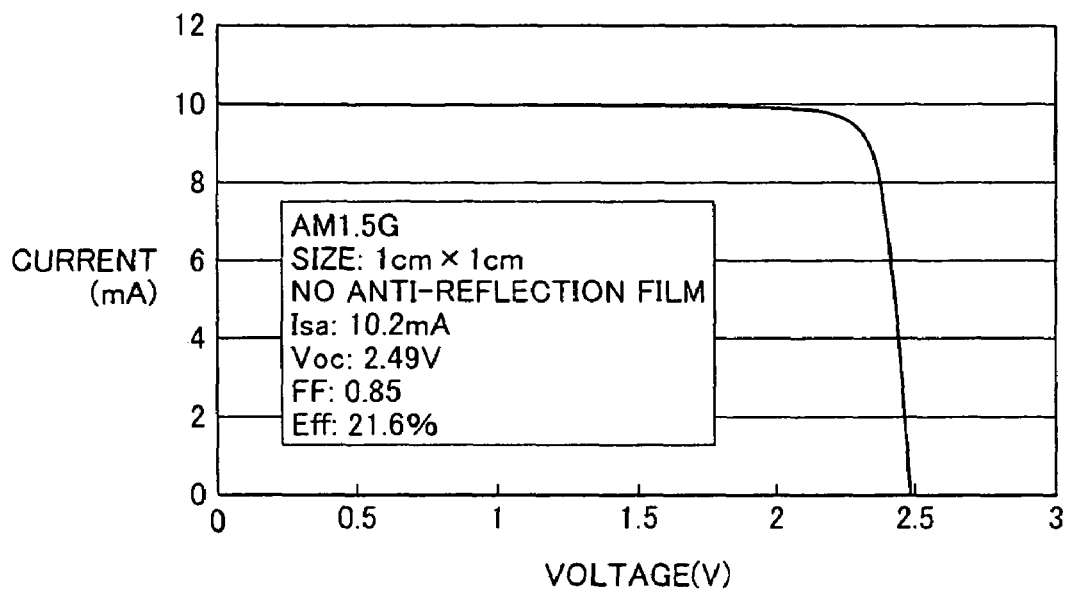
FIG. 19 represents current-voltage characteristic of the compound solar battery in accordance with the first embodiment, obtained by a solar simulator.

Evaluation of the above described compound solar battery made by the solar simulator will be described in the following. FIG. 19 shows the measured current-voltage characteristic (I-V curve). Here, the short circuit current was 10.2 mA, open circuit voltage was 2.49 V, fill factor was 0.85 and conversion efficiency was 21.6%.

From these results, it was found that the compound solar battery described above had higher open circuit voltage and higher conversion efficiency, as compared with the conventional 2-junction type compound solar battery having two pn-junctions of InGaAs and GaAs formed on a GaAs substrate.

Fourth Embodiment

A compound solar battery in accordance with a fourth example embodiment will be described. Another example of a 3-junction type compound solar battery having bottom cell, middle cell and top cell as the cell body will be described.

Figure 20:
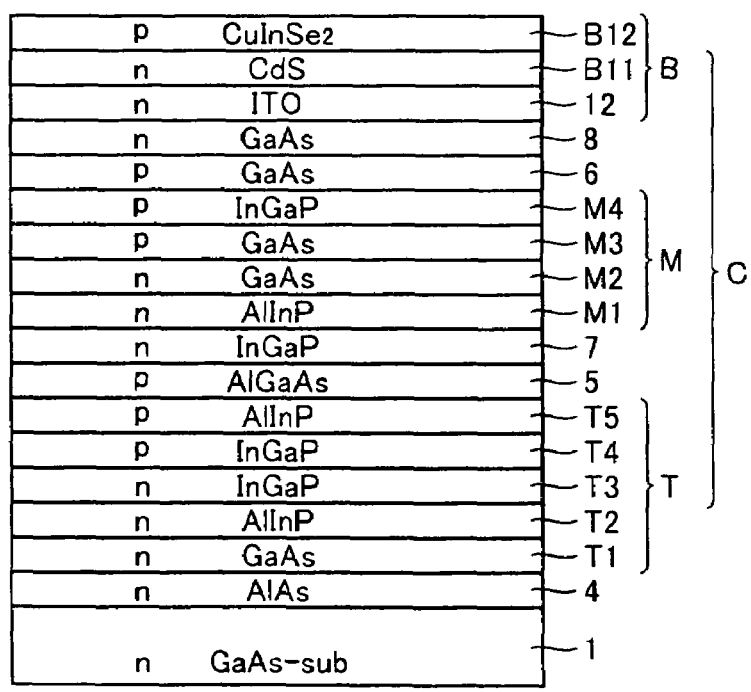
FIG. 20 is a cross section representing a step of manufacturing a compound solar battery in accordance with a fourth example embodiment.

First, manufacturing method will be described. In the similar manner as described in the first embodiment, layers to be the top cell and layers to be the middle cell are successively formed on GaAs substrate 1, as shown in FIG. 20.

On InGaP layer M4 of the middle cell M, a p-type GaAs layer 6 and an n-type GaAs layer 8 are successively formed as a tunnel junction. Thereafter, on GaAs layer 8, layers to be the bottom cell B are formed.

Specifically, an ITO (Indium Tin Oxide) film 10, a CdS film B11 and CuInSe$_2$ film B12 are successively formed. ITO film 12 is formed, by way of example, by sputtering. CdS film B11 is formed, by way of example, by vapor deposition. CuInSe$_2$ film is formed, by way of example, by vapor deposition.

In this manner, the cell body C of the 3-junction type compound solar battery including top cell T, middle cell M and bottom cell B is formed.

Thereafter, on the surface of cell body C (p-type CuInSe$_2$ film of the bottom cell), a prescribed resist pattern (not shown) for forming the back surface electrode is formed. An Mo film (not shown) is vapor-deposited to cover the resist pattern.

Thereafter, by lift-off method, the resist pattern and the Mo film positioned on the resist pattern are removed. Thereafter, in a nitrogen atmosphere, heat treatment of about one minute is performed at a temperature of about 400° C.

Thereafter, a prescribed resist pattern (not shown) is formed except for a region on which the Mo film is formed. Further, a resist (not shown) is applied to that side of the GaAs substrate 1 on which cell body C is not formed.

Figure 21:
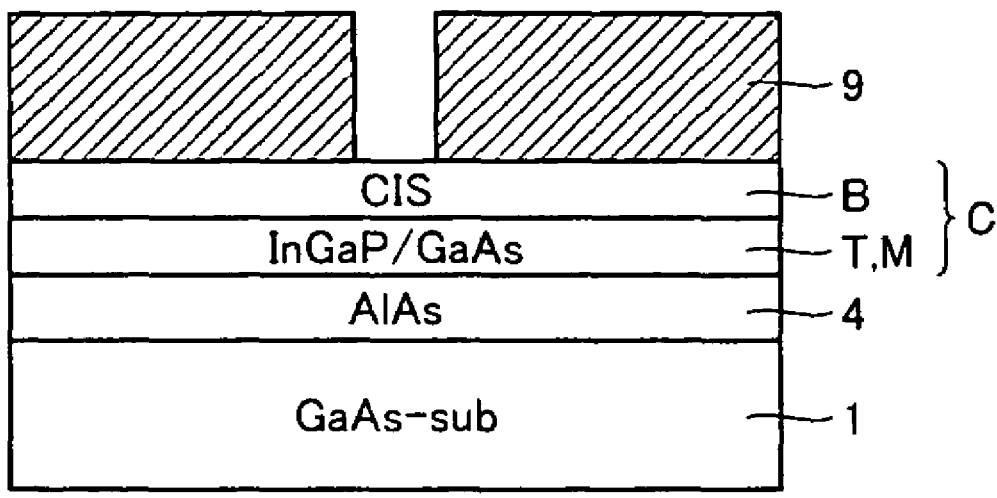
FIG. 21 is a cross section representing a step following the step shown in FIG. 20 in accordance with the fourth embodiment.

Thereafter, an Au plated layer (not shown) having the thickness of about 30 μm is formed on the Mo film by electrolytic plating. Thereafter, by lift-off method, the resist pattern and the Au plated film positioned on the resist pattern are removed. In this manner, a back surface electrode 9 of Au plating is formed on the cell body, as shown in FIG. 21.

Figure 22:
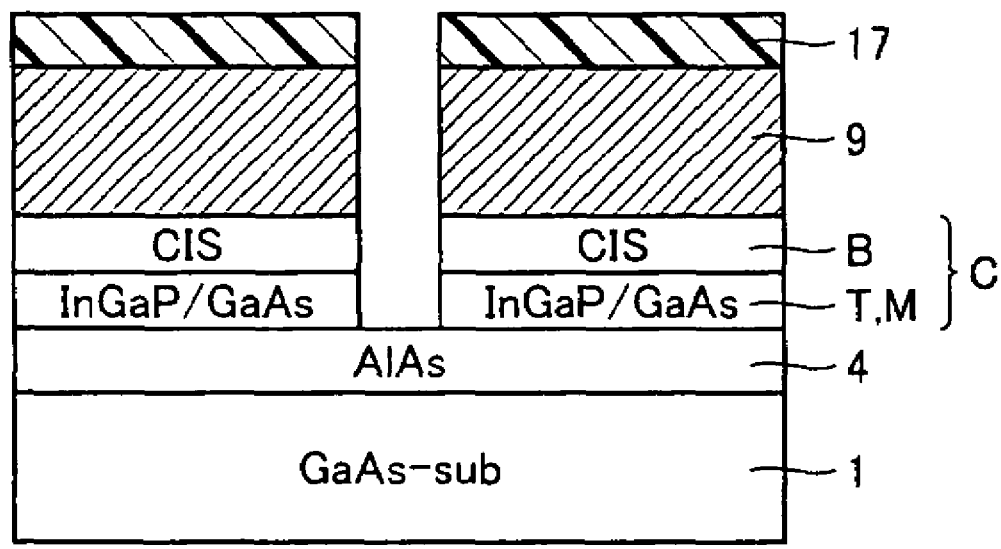
FIG. 22 is a cross section representing a step following the step shown in FIG. 21 in accordance with the fourth embodiment.

Thereafter, a prescribed resist pattern 17 is formed to cover back surface electrode 9 in a region where back surface electrode 9 is formed and to expose the surface of cell body C in a region where back surface electrode 9 is not formed, as shown in FIG. 22.

Using the resist pattern 17 as a mask, prescribed etching is performed, so that the portion of the exposed cell body C is removed and AlAs layer 3 as the intermediate layer is exposed. Thereafter, resist pattern 17 is removed.

Figure 23:
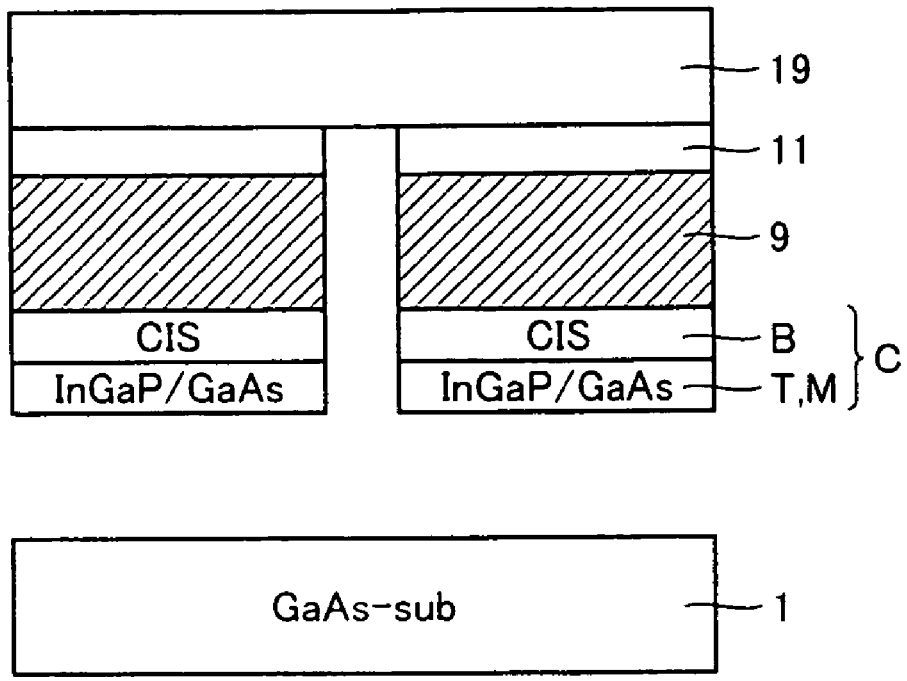
FIG. 23 is a cross section representing a step following the step shown in FIG. 22 in accordance with the fourth embodiment.

Thereafter, as shown in FIG. 23, a mesh-shaped resin plate 19 having chemical resistance is adhered to the side of back surface electrode 9, with wax 11 interposed. With resin plate 19 adhered on back surface electrode 9, the cell body C and back surface electrode 9 are dipped in a hydrofluoric acid solution.

Dipped in the hydrofluoric acid solution, AlAs layer 3 is removed, and therefore, the cell body C is separated from GaAs substrate 1. In this manner, GaAs substrate 1 is separated and the n-type GaAs layer of the top cell of cell body C is exposed.

Thereafter, on the exposed surface of GaAs layer, a prescribed resist pattern for forming a surface electrode (not shown) is formed. Thereafter, cell body C with the resist pattern formed is introduced. Thereafter, cell body C with the resist pattern formed thereon is introduced to a vacuum vapor deposition apparatus (not shown) together with resin plate 19.

By resistance heating method, an Au film (containing 12% by weight of Ge) having the thickness of about 100 nm is formed to cover the resist pattern. Thereafter, by EB (Electron Beam) vapor deposition method, an Ni layer having the thickness of about 20 nm and an Au layer having the thickness of about 5000 nm (both not shown) are formed continuously.

Figure 24:
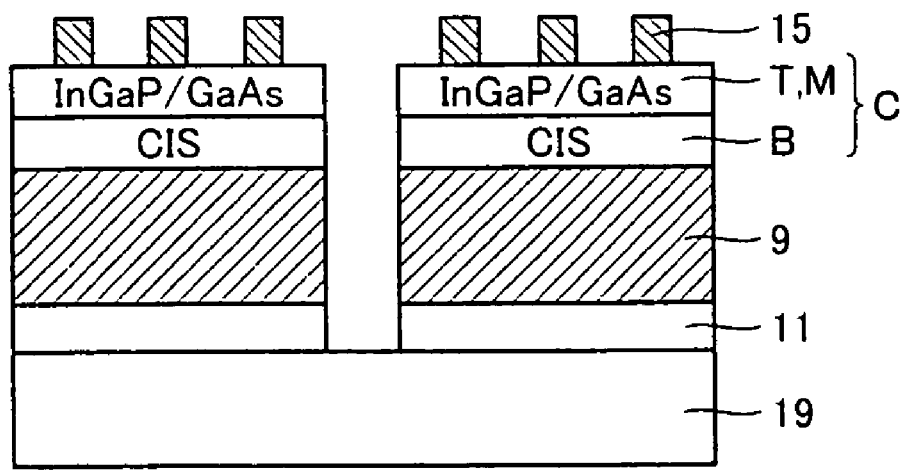
FIG. 24 is a cross section representing a step following the step shown in FIG. 23 in accordance with the fourth embodiment.

Thereafter, by lift-off method, the resist pattern and the Au film and the like formed on the resist pattern are removed. In this manner, surface electrode 15 is formed as shown in FIG. 24.

Figure 25:
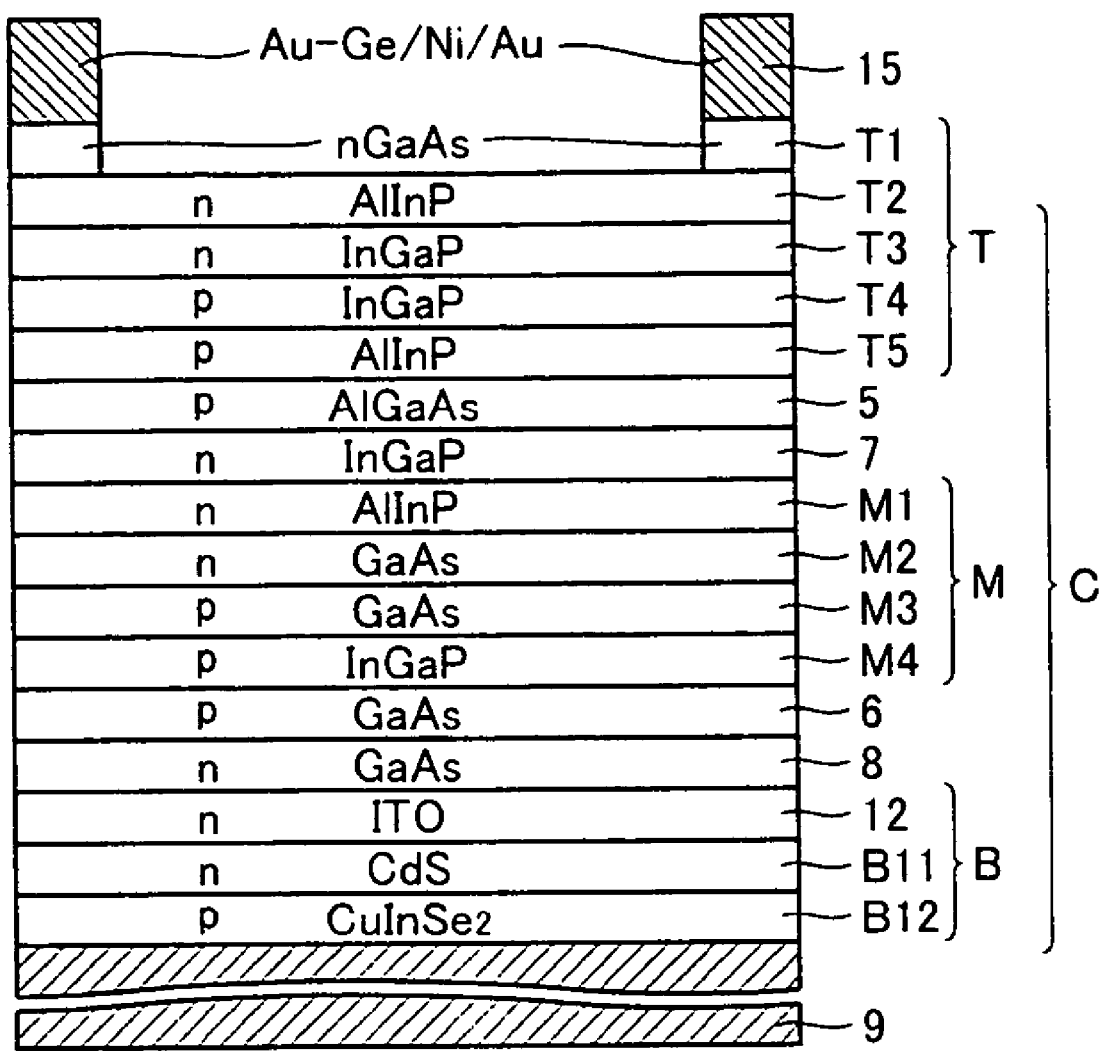
FIG. 25 is a cross section representing a step following the step shown in FIG. 24 in accordance with the fourth embodiment.

Thereafter, using surface electrode 15 as a mask, etching with alkali solution is performed to remove exposed GaAs layer, and the AlInP layer is exposed (see FIG. 25).

Next, by EB vapor deposition method, a TiO$_2$ film having the thickness of about 55 nm and an MgF$_2$ film having the thickness of about 100 nm (both not shown) are formed successively as anti-reflection films, on the sunlight entering side (surface). Thereafter, by removing wax 11 using toluene, for example, resin plate 19 is separated from back surface electrode 19, as shown in FIG. 25.

Thereafter, by cutting the Au plated film along the exposed line-shaped Au plated film, twelve compound solar batteries having the size of 10 mm×10 mm, by way of example, are fabricated.

FIG. 25 shows a cross-sectional structure of the compound solar battery manufactured in this manner. As shown in FIG. 25, as compared with the structure of the conventional solar battery having the bottom cell formed on a prescribed substrate for epitaxial growth (see, for example, FIG. 34 or 35), the present compound solar battery has the back surface electrode 9 formed directly on the bottom cell B of cell body C.

Further, surface electrode 15 is formed on the surface of top cell T of cell body C. Middle cell M is formed between top cell T and bottom cell B. Thus, a 3-junction type compound solar battery is provided, which includes as the cell body, the bottom cell B, middle cell M and top cell T.

Particularly, different from the top cell T and the middle cell M that are formed by epitaxial growth, the bottom cell B has CdS film B11 and $CuInSe_2$ film B12 that are formed by vapor deposition.

Therefore, the cell body C includes a bottom cell having a pn-junction of $CuInSe_2$ (I-III-VI group compound) and CdS (II-VI group compound), a middle cell M having a pn-junction of GaAs (III-V group compound) and a top cell T having a pn-junction of InGaP (III-III-V group compound).

In the solar battery cell described above, on the GaAs substrate 1 for epitaxial growth, layers to be the top cell T having the band gap of about 1.7 to about 2.1 eV are successively formed by epitaxial growth.

Then, on the top cell T, layers to be the middle cell M having the band gap of about 1.3 to about 1.6 eV are successively formed. Further, on the middle cell M, layers to be the bottom cell B having the band gap of about 0.9 to 1.1 eV are successively formed by sputtering and vapor deposition, different from epitaxial growth.

In this manner, in the compound solar battery described above, layers to be the top cell are formed first and the layers to be the bottom cell are formed last. Therefore, even when a material having larger band gap (about 0.9 to about 1.1 eV) than a conventional material (~0.7 eV) is used for the bottom cell B, the quality of the bottom cell B does not have any influence on the middle cell M and the top cell T, and the conversion efficiency of the compound solar battery can be improved.

Further, as the quality of bottom cell B does not have any influence on the top cell T and middle cell M, layers to be the bottom cell B can be formed by a method other than epitaxial growth.

Therefore, as the material of the layers to be the bottom cell having a relatively high band gap (0.9 eV~1.1 eV), a material other than a single crystal material, such as polycrystalline $CuInSe_2$ film B12 can be applied, and thus, material of the layers to be the bottom cell and the method of manufacturing the same can be selected from wider variety.

Fifth Embodiment

Figure 26:
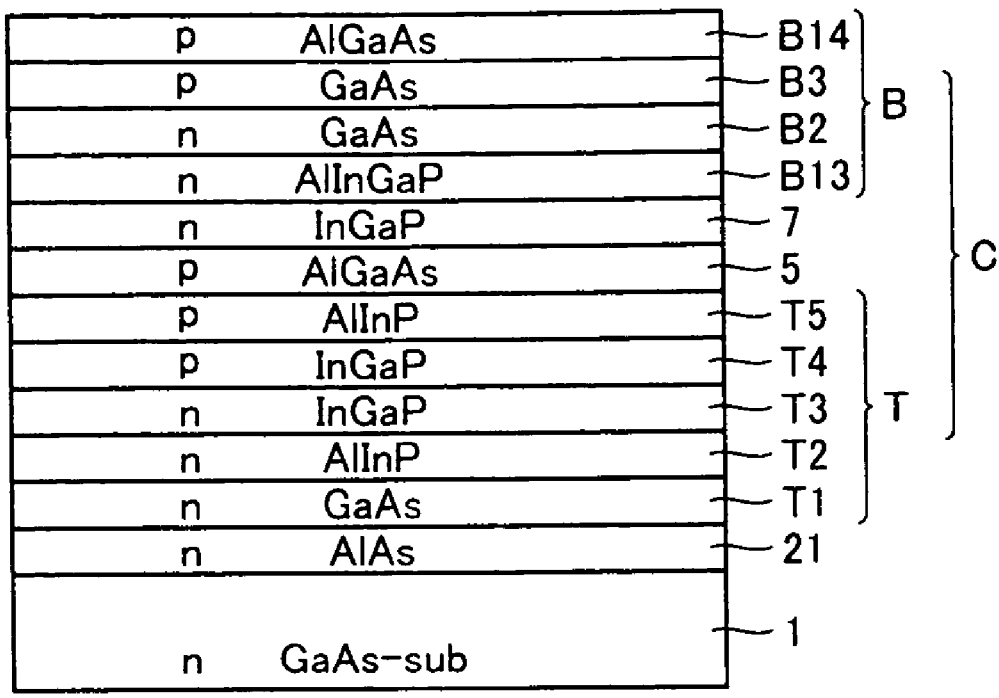
FIG. 26 is a cross section representing a step of manufacturing a compound solar battery in accordance with a fifth example embodiment.

A compound solar battery in accordance with a example fifth embodiment will be described. Another example of 2-junction type compound solar battery will be described. First, manufacturing method will be described. In the similar manner as described in the first embodiment, on GaAs substrate 1, layers T1 to T5 to be the top cell T and layers B13, B2, B3, B14 to be the bottom cell B are successively formed, with an intermediate layer (n-type AlAs layer 21) interposed, to form a cell body C of the 2-junction type compound solar battery including top cell T and bottom cell B, as shown in FIG. 26.

Figure 27:
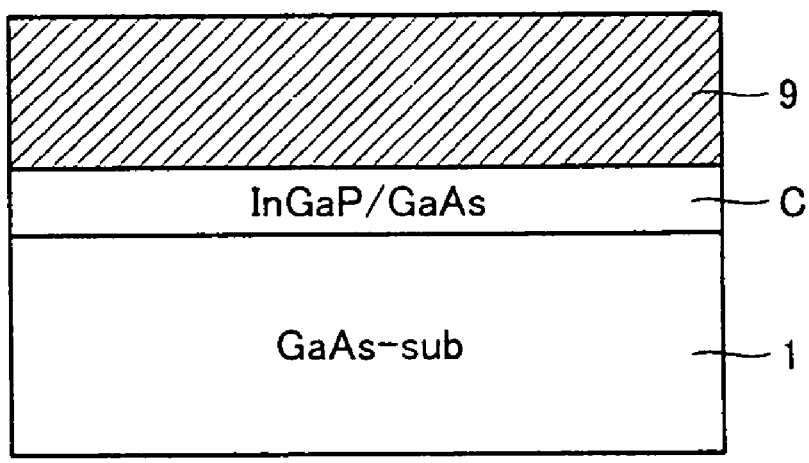
FIG. 27 is a cross section representing a step following the step shown in FIG. 26 in accordance with the fifth embodiment.
Figure 28:
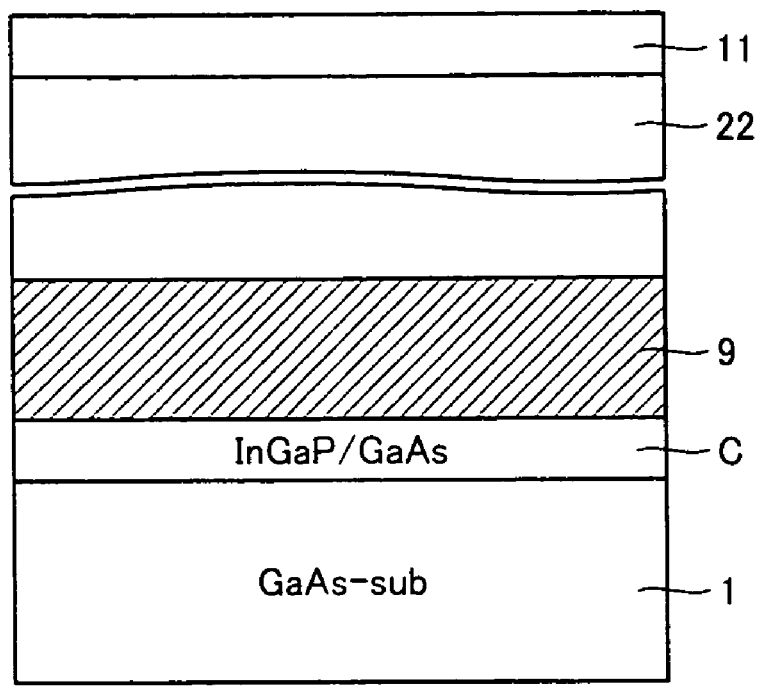
FIG. 28 is a cross section representing a step following the step shown in FIG. 27 in accordance with the fifth embodiment.

Thereafter, in the similar manner as described in the first embodiment, back surface electrode 9 of Au plated film is formed on the cell body C, as shown in FIG. 27. Thereafter, a film material 22 having erosion resistance, heat resistance and weather resistance such as a kapton (registered trademark) tape is adhered to back surface electrode 9, as shown in FIG. 28. Wax 11 is applied to film material 22 for protection.

Figure 29:
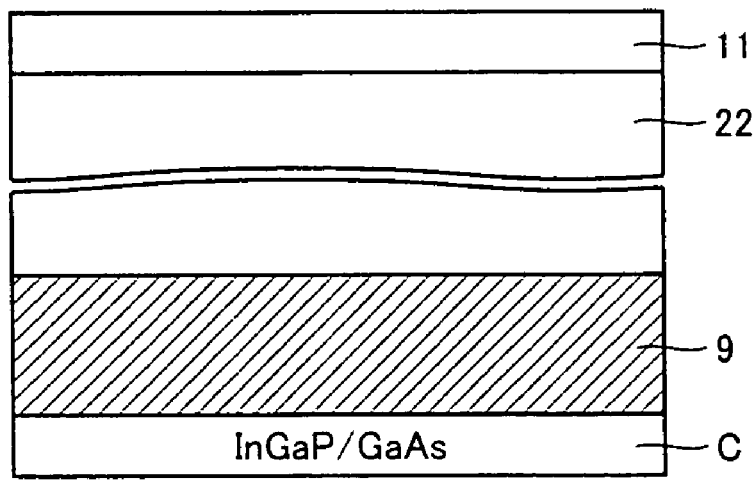
FIG. 29 is a cross section representing a step following the step shown in FIG. 28 in accordance with the fifth embodiment.

Then, GaAs substrate 1 on which cell body C is formed is dipped, for example, in a mixed solution of hydrofluoric acid and water ($HF:H_2O=1:10$) for about 5 hours, so that the intermediate layer (N-type AlAs layer 21) having the thickness of about 5 to about 10 nm positioned between the cell body C and GaAs substrate 1 is etched and the cell body C is separated from GaAs substrate 1 (not shown), as shown in FIG. 29.

The surface of the separated GaAs substrate 1 is not etched but kept in a mirror finished state, and therefore, the substrate can be used again as a substrate for epitaxial growth.

Figures 30, 31, 32:
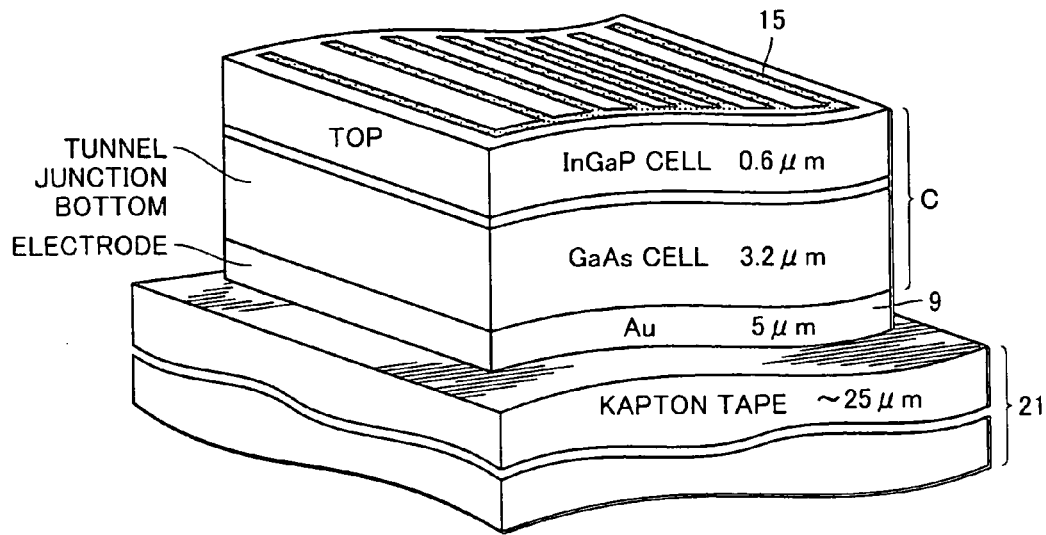
FIG. 30 is a perspective view showing an appearance of the finished compound solar battery in accordance with the fifth embodiment.
FIG. 31 is a cross section representing a step of manufacturing a compound solar battery in accordance with a sixth example embodiment.
FIG. 32 is a cross section representing a step following the step shown in FIG. 31 in accordance with the sixth embodiment.

Thereafter, in the similar manner as described in the first embodiment, surface electrode 15 is formed on the surface of cell body C. In this manner, a 2-junction type solar battery is formed as shown in FIG. 30.

In the compound solar battery described above, back surface electrode 9 is formed on a prescribed film member 22 and on back surface electrode 9, cell body C is directly formed. Surface electrode 15 is formed on cell body C. The compound solar battery having the film member 22 and cell body C integrated together can be directly applied as a solar battery panel.

In the above described embodiments, a back surface electrode of Au plated film having the thickness of about 30 µm has been mainly described as the back surface electrode 9. Thickness of back surface electrode 9, however, is not limited thereto, provided that it is thick enough to support the cell body C.

Therefore, back surface electrode 9 may have such a thickness that allows deflection. Alternatively, back surface electrode 9 may have such a thickness that allows deflection dependent on the material of the electrode 9.

In that case, the compound solar battery having the back surface electrode 9 formed on cell body C can freely be deflected, and degree of freedom in shape is improved.

Sixth Embodiment

Here, a compound solar battery including a cell body having one surface electrode of one polarity formed on a light entering side and a transparent conductive film to be a back surface electrode of the other polarity formed on the back surface side, and another cell adhered to the transparent conductive film, will be described.

In the compound solar battery, the cell body or the aforementioned another cell body is formed of a single crystal thin film formed by epitaxial growth. As the substrate used for the epitaxial growth is completely removed, the compound solar battery can be made thin and efficiency can be improved. Further, the compound solar battery is hard to break.

Between the cell body formed of the epitaxially grown single crystal thin film and another cell body holding the same, the transparent conductive film to be the back surface electrode is formed. Therefore, electric resistance from the epitaxial layer can sufficiently be lowered. Further, if the holding material itself is made conductive, electric resistance between the holding material and the epitaxial layer can further be lowered.

Preferable material for forming the transparent conductive film may have transmittance of at least 70% of light having wavelength of 850 nm or longer and resistance of at most 1 $\Omega \cdot cm$, and such material includes ITO, $In_2O_3$, $SnO_2$, ZnO, CdO, $TiO_2$, $CdIn_2O_4$, $Cd_2SnO_4$ and $Zn_2SnO_4$.

As already described, in order to improve power generation efficiency of a compound solar battery, it is effective to superpose a plurality of solar batteries (multi-junction) formed of materials having different absorption wavelengths. Specifically, it is preferred in the cell body of the compound solar battery that a cell having a pn-junction layer formed of a material having a relatively high band gap on the sunlight entering side and a cell having a pn-junction layer formed of a material having a relatively low band gap on the back surface side are formed, and that such a plurality of cells are joined by a tunnel junction layer.

Further, it is preferred in another cell body adhered through the transparent conductive film, that a pn-junction layer formed of a material having a band gap still lower than the band gap of the cell of the cell body is provided.

Specifically, it is preferred that in the cell body, a cell having a pn-junction layer formed of (Al)InGa(As)P single crystal material (band gap: 1.7~2.1 eV) is arranged on the light entering side and a cell having a pn-junction formed of (Al)(In)GaAs(P) single crystal material (band gap: 1.3~1.6 eV) is arranged on the back surface side, and that the plurality of such cells are joined by tunnel junction. Further, it is preferred that in another cell body, a cell having a pn-junction layer formed of InGaAs(P) single crystal material (band gap: 0.7~1.2 eV, more preferably, 0.9~1.1 eV) is arranged.

As the aforementioned another cell body, a cell having a pn-junction formed of a I-III-VI group compound of CuInGaSeS material is more preferable. The band gap of the cell body is preferably 0.7~1.2 eV and, more preferably, 0.9~1.1 eV.

Alternatively, it is preferred that in the cell body, a cell having a pn-junction layer formed of (Al)InGa(As)P single crystal material (band gap: 1.8~2.1 eV) is arranged on the light entering side and a cell having a pn-junction formed of (Al)(In)GaAs(P) single crystal material (band gap: 1.4~1.6 eV) is arranged on the back surface side, and that the plurality of such cells are joined by tunnel junction.

As the aforementioned another cell body, an Si solar battery is preferred. As the Si solar battery, a single crystal Si solar battery is more preferred, as the solar battery itself serves as a substrate and attains high power generation efficiency.

In the method of manufacturing the multi-junction type compound solar battery, when layers to be the cell are to be epitaxially grown after an intermediate layer is formed on a semiconductor substrate, layers are grown starting from the layer positioned on the light entering side of the solar battery to the layer positioned on the back side, in a direction opposite to the conventional manufacturing method, so that a surface of the cell to be the bottom is exposed.

Thereafter, a transparent conductive film to be the back surface electrode of the compound solar battery is formed on the surface of the exposed layer, and another cell body having a certain strength is adhered to the transparent conductive film. Thereafter, the semiconductor substrate for epitaxial growth is removed.

The semiconductor substrate is separated at the middle layer positioned between the semiconductor substrate and the cell body. Thus, the semiconductor substrate can be removed without damaging the cell body and another cell body. When the thickness of the compound semiconductor becomes 10 μm or thinner, elasticity of the semiconductor improves and it becomes harder to break. Therefore, a compound solar battery that is hard to break can be manufactured through the above described manner.

Further, as the semiconductor substrate is not made thin but completely removed, breakage of the substrate caused by unevenness of the compound solar battery can be prevented. Further, as the unnecessary substrate is eliminated, the weight of the compound solar battery can be reduced, and power generation efficiency can be improved.

When the intermediate layer left after the removal of the semiconductor substrate is removed, the surface of the cell body comes to be exposed. By forming a prescribed surface electrode or the like on the exposed surface, a multi-junction type compound solar battery can be obtained.

As to the solvent used for separating the semiconductor substrate from the cell body, it is preferred that the semiconductor substrate is removed quickly, dissolution is stopped at the intermediate layer and the dissolution of the cell body is prevented, and therefore, a solvent, of which solubility of semiconductor substrate is higher than that of the intermediate layer is preferred. Specifically, a solvent, of which solubility of the semiconductor substrate is at most 5% of the solubility of the intermediate layer is preferred, and at most 3% is more preferred.

When GaAs, Ge or the like is used as the material of the semiconductor substrate and InGaP, AlInP, AlAs or the like is used as the material of the intermediate layer, an acid solution of concentrated hydrochloric acid is preferred.

When the aforementioned another cell body is adhered to the transparent conductive film, electric resistance at the junction portion should be sufficiently lowered. Therefore, preferably, the transparent conductive film is formed on a surface of the said another cell, and the transparent conductive film on the said another cell is adhered to the transparent conductive film on the device, with a transparent conductive adhesive interposed.

As the transparent conductive adhesive, one having transmittance of at least 70% with respect to light of the wavelength of 850 nm or longer and having resistance of 1 $\Omega \cdot cm$ or lower should be used, and ink of ITO, $In_2O_3$, $SnO_2$, ZnO, CdO, $TiO_2$, $CdIn_2O_4$, $Cd_2SnO_4$ or $Zn_2SnO_4$ is suitable.

The method of manufacturing the compound solar battery will be more specifically described. First, in the similar manner as described in the first embodiment, on a surface of GaAs substrate 1, layers C11 to C15 to be a top cell C1, p-type AlGaAs layer 5 and n-type InGaP layer 7 to be the tunnel junction, and layers C21 to C24 to be a bottom cell C2 are formed successively, with an intermediate layer (n-type InGaP layer 3) interposed, as shown in FIG. 31. On layer C24, a p-type GaAs layer 21 and an n-type GaAs layer 22 to be the tunnel junction are formed. In this manner, one cell body C including top cell C1 and bottom cell C2 is formed. On the surface of n-type GaAs layer 22, a transparent conductive film (ITO film 1) 33 (see FIG. 33) to be an n-type ohmic electrode is formed by sputtering.

Thereafter, layers C31 to C34 to be a cell are successively formed on an InP substrate 30, and another cell body CA including cell 3 is formed, as shown in FIG. 32. On a surface of n-type InP layer C34 of cell C3, a transparent conductive film (ITO film 2) 31 (see FIG. 33) to be an ohmic electrode is formed by sputtering.

Thereafter, on transparent conductive film 33 (ITO film 1) and transparent conductive film 31 (ITO film 2), liquid ITO ink is applied, and the ink-applied surfaces are adhered together. In the adhered state, pre-baking at 200° C. is performed, and thereafter, ITO ink is dried and sintered at 400° C. for 60 minutes, whereby an ITO ink sintered layer 32 (see FIG. 33) is formed. Transparent conductive films 31 and 33 and ITO ink sintered layer 32 constitute the back surface electrode 9.

Thereafter, GaAs substrate 1 is dipped in an alkali solution to etch GaAs substrate 1, whereby GaAs substrate 1 is removed. GaAs substrate 1 having the thickness of 350 μm is fully etched and removed after about 300 minutes. Etching is stopped at the intermediate layer (n-type InGaP layer 3).

Thereafter, the intermediate layer (n-type InGaP layer 3) is etched by an acid solution, so that the remaining intermediate layer is removed and n-type GaAs layer C11 to be an n-type cap layer is exposed. Thereafter, through similar steps as described in the first embodiment, a surface electrode 15 is formed on the exposed surface of n-type GaAs layer C11. Thereafter, using the surface electrode 15 as a mask, etching with an alkali solution is performed, whereby exposed n-type GaAs layer C11 is removed and AlInP layer C12 is exposed.

Thereafter, a prescribed resist pattern (not shown) for mesa etching is formed to cover surface electrode 15. Using the resist pattern as a mask, etching with an alkali solution and an acid solution is performed, so that epitaxial layers are removed and transparent conductive film 33 is exposed. By etching with an acid solution, exposed ITO film is removed, and further by a prescribed etching, InGaAsP layers C32 and C31 are removed and InP substrate 30 is exposed.

Then, on the back surface of InP substrate 30, an Au—Zn film is vapor-deposited, and by heat treatment for one minute at 400° C. in a nitrogen atmosphere, an ohmic electrode 34 is formed. Further, a TiO$_2$ film (having the thickness of 55 nm) and an MgF$_2$ film (having the thickness of 100 nm) may be formed continuously on the surface, as an anti-reflection film, by EB vapor deposition method.

By cleavage at portions of InP substrate 30 that are exposed by mesa etching, twelve compound solar batteries having the size of 10 mm×10 mm, for example, are fabricated.

Figure 33:
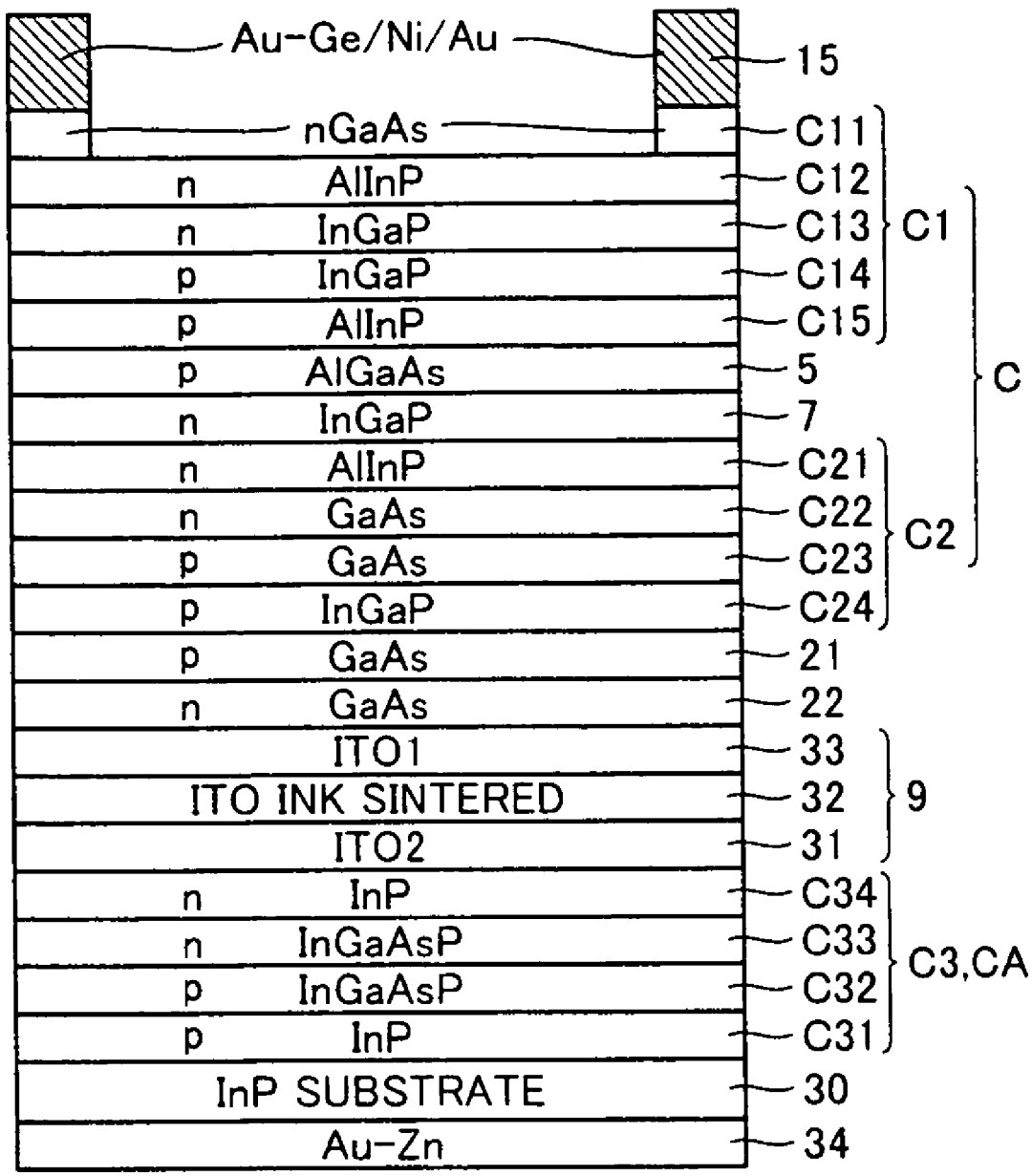
FIG. 33 is a perspective view showing an appearance of the finished compound solar battery in accordance with the sixth embodiment.

FIG. 33 shows a cross sectional structure of the compound solar battery manufactured in this manner. As can be seen from FIG. 33, one cell body C is formed on the light entering side and another cell body CA is formed on the side opposite to the light entering side, with a back surface electrode 9 formed of a transparent conductive material interposed.

Using a reference sunlight having air mass (AM) of 1.5 G, the compound solar battery described above was evaluated by a solar simulator, and current-voltage characteristic at the time of irradiation, short circuit current, open circuit voltage, fill factor and conversion efficiency were measured.

In the embodiments above, back surface electrode 9 may be formed, for example, by printing or spraying, other than the above described plating method.

Assuming that the back surface electrode has such a form as described above, preferable thickness of back surface electrode 9 is about 2 to about 500 μm.

In each of the compound solar batteries described above, the substrate for epitaxial growth is eventually removed, and therefore, thermal conductivity between the cell body and the heat sink is improved. As a result, temperature increase of the cell body of the compound solar battery can be suppressed.

Further, the removed substrate for epitaxial growth can be used again, enabling cost reduction.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a compound solar battery, comprising the acts of:
    forming a first cell having a first band gap on a surface of a semiconductor substrate by epitaxial growth;
    forming a second cell having a second band gap lower than said first band gap on the first cell;
    forming a first electrode portion having a prescribed thickness to support said first cell and said second cell, directly on said second cell;
    separating said first cell from said semiconductor substrate;
    forming a second electrode portion on a surface of the first cell exposed by separation from said semiconductor substrate;
    wherein in forming said first electrode portion, said first electrode portion is formed of a transparent conductive film and,
    adhering, to said first electrode portion, a third cell having a band gap lower than said second band gap after forming said first electrode and before separating said first cell from said semiconductor substrate.

2. The method of manufacturing a compound solar battery according to claim 1, further comprising the step of
    forming a prescribed intermediate layer between the first cell and said semiconductor substrate; wherein
    separating the first cell from said semiconductor substrate includes removing said semiconductor substrate by etching and further removing said intermediate layer.

3. The method of manufacturing a compound solar battery according to claim 1, further comprising the step of
    forming a prescribed intermediate layer by epitaxial growth between the first cell and said semiconductor substrate; wherein
    separating said first cell from said semiconductor substrate includes removing said intermediate layer by etching to remove said semiconductor substrate.

4. The method of manufacturing a compound solar battery according to claim 1, wherein
    adhering said third cell to said first electrode portion includes
    forming a transparent conductive film on a surface of said third cell, and adhering said third cell to said first electrode portion by a transparent conductive adhesive.

* * * * *